US012801170B2

(12) United States Patent
Morita et al.

(10) Patent No.: US 12,801,170 B2
(45) Date of Patent: Nov. 17, 2026

(54) CIRCUIT DEVICE, ELECTRO-OPTICAL DEVICE, AND ELECTRONIC APPARATUS

(71) Applicant: SEIKO EPSON CORPORATION, Tokyo (JP)

(72) Inventors: Akira Morita, Chino (JP); Chihiro Shin, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 7 days.

(21) Appl. No.: 18/895,401

(22) Filed: Sep. 25, 2024

(65) Prior Publication Data

US 2025/0110516 A1 Apr. 3, 2025

(30) Foreign Application Priority Data

Sep. 28, 2023 (JP) ................................ 2023-167257

(51) Int. Cl.
*H03K 5/02* (2006.01)
*G05F 1/56* (2006.01)
*G06F 7/523* (2006.01)
*H03F 3/45* (2006.01)

(52) U.S. Cl.
CPC ................ *G05F 1/56* (2013.01); *G06F 7/523* (2013.01); *H03F 3/45475* (2013.01)

(58) Field of Classification Search
CPC ............ H03K 5/01; H03K 5/02; H03K 5/125; H03K 5/1252; G05F 1/10; G05F 1/46; G05F 1/461; G06F 7/523; G06F 1/56; G06F 1/561; H03F 3/45475
See application file for complete search history.

(56) References Cited

U.S. PATENT DOCUMENTS 6,366,065 B1 * 4/2002 Morita ................ G09G 3/3688 323/280
2018/0226047 A1 8/2018 Morita
2019/0088229 A1 3/2019 Morita
2021/0065607 A1 * 3/2021 Nomura .............. G09G 3/2007

FOREIGN PATENT DOCUMENTS

JP 2016090881 5/2016
JP 2019056799 4/2019
JP 2021033095 3/2021
JP 2021033111 3/2021

* cited by examiner

*Primary Examiner* — Long Nguyen
(74) *Attorney, Agent, or Firm* — JCIPRNET

(57) ABSTRACT

A circuit device includes an amplifier circuit and a voltage output circuit. An output terminal of the amplifier circuit is coupled to an inverted input terminal of the amplifier circuit. The amplifier circuit outputs a driving voltage to a capacitive load. The voltage output circuit outputs, to a non-inverted input terminal of the amplifier circuit, an output voltage corresponding to a D/A conversion voltage of input data. The voltage output circuit raises the output voltage above the D/A conversion voltage when the driving voltage overshoots the D/A conversion voltage due to a change of the input data in a positive direction.

11 Claims, 17 Drawing Sheets

CIRCUIT DEVICE, ELECTRO-OPTICAL DEVICE, AND ELECTRONIC APPARATUS

The present application is based on, and claims priority from JP Application Serial Number 2023-167257, filed Sep. 28, 2023, the disclosure of which is hereby incorporated by reference herein in its entirety.

BACKGROUND

1. Technical Field

The present disclosure relates to a circuit device, an electro-optical device, and an electronic apparatus.

2. Related Art

JP-A-2021-33095 discloses a display driver that assists in driving an output line of a D/A converter circuit. The display driver includes the D/A converter circuit, an assist circuit, and an amplifier circuit. The assist circuit includes a capacitor group and a driving circuit the outputs a driving signal group to ends of a plurality of capacitors included in the capacitor group. The amplifier circuit outputs a signal to an electro-optical panel, based on a voltage applied to the output line. Before the D/A converter circuit applies a driving voltage, based on a video signal, the assist circuit initializes a potential applied to the output line of the D/A converter circuit, and applies a voltage closer to the video signal to the output line through capacitive driving.

The amplifier circuit controls an output voltage of an output node, based on a feedback from the output node. Thus, the amplifier circuit reduces the output voltage when the output voltage is higher than a target voltage, and increases the output voltage when the output voltage is lower than the target voltage. With this, there arises a problem where a ringing occurs in the output voltage, resulting in a longer time for the output voltage to converge to the target voltage. When the amplifier circuit drives a capacitive load, the charge transfer to a capacitor is hindered by a ringing before the capacitance of the capacitive load is charged to the target voltage. As a result, the time for the output voltage to converge to the target voltage is prolonged.

SUMMARY

One aspect of the present disclosure relates to a circuit device including an amplifier circuit including an output terminal coupled to an inverted input terminal and being configured to output a driving voltage to a capacitive load, and a voltage output circuit configured to output, to a non-inverted input terminal of the amplifier circuit, an output voltage corresponding to a D/A conversion voltage of input data, wherein the voltage output circuit raises the output voltage above the D/A conversion voltage when the driving voltage overshoots the D/A conversion voltage due to a change of the input data in a positive direction.

Further, another aspect of the present disclosure relates to an electro-optical device including the above-mentioned circuit device and an electro-optical panel.

Still, another aspect of the present disclosure relates to an electronic apparatus including the above-mentioned circuit device.

DESCRIPTION OF EMBODIMENTS

Hereinafter, exemplary embodiments of the present disclosure are described below in detail. Note that the embodiments described hereinafter are not intended to unjustly limit the content as set forth in the claims, and all of the configurations described in the embodiments are not always necessary constituent elements.

1. First Configuration Example

Figure 1:
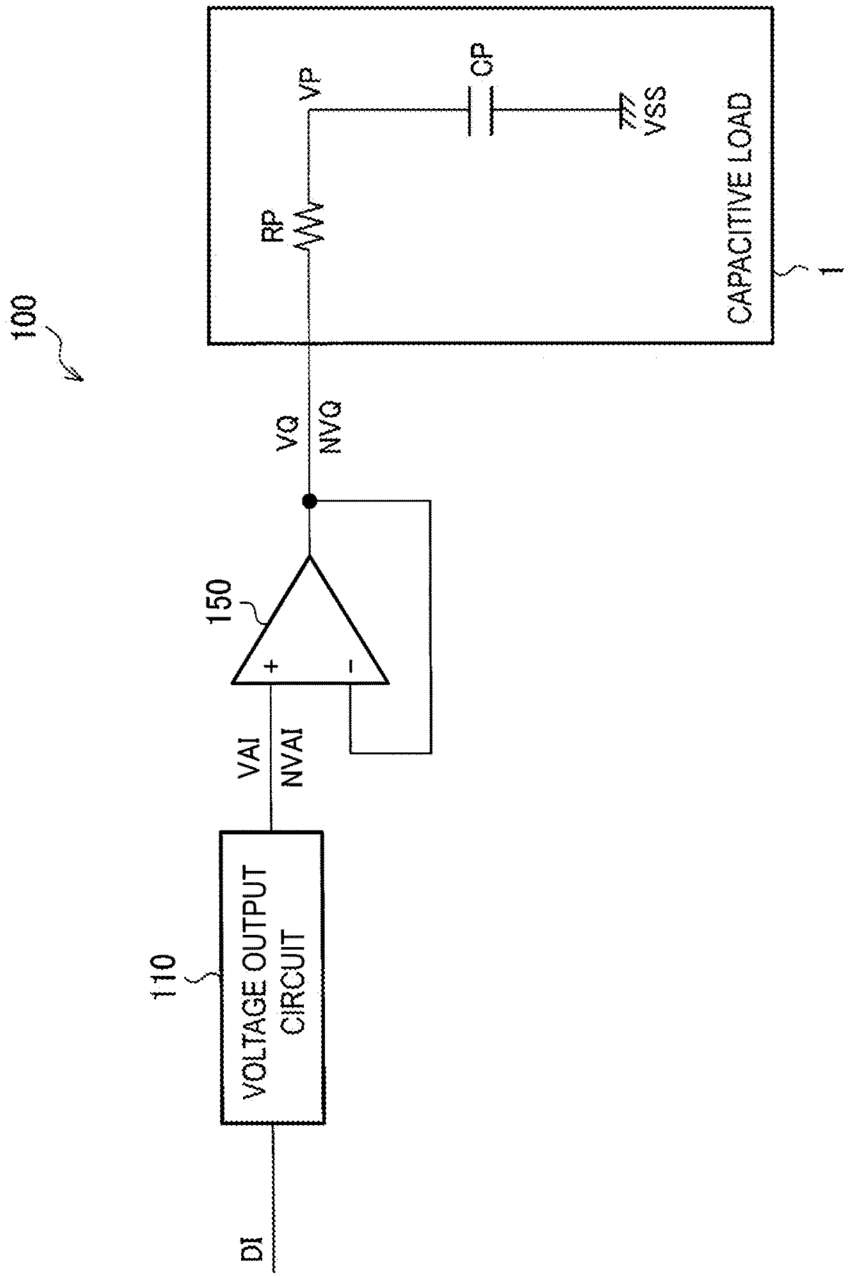
FIG. 1 illustrates a first configuration example of a circuit device.

FIG. 1 illustrates a first configuration example of a circuit device. A circuit device 100 includes a voltage output circuit 110 and an amplifier circuit 150. For example, the circuit device 100 is an integrated circuit device in which a plurality of circuit elements are integrated on a semiconductor substrate.

The circuit device 100 drives a capacitive load 1 coupled to an output node NVQ. The capacitive load 1 includes a resistor RP and a capacitor CP that are coupled in series between the output node NVQ, and a grand node or the like. The resistor RP is a parasitic resistor of a wiring line, a resistor as a circuit element, or the like. The capacitor CP is a parasitic capacitor of a wiring line, a capacitor as a circuit element, or the like. The capacitive load 1 may be inside or outside of the circuit device 100. In one example, the circuit device 100 is a driver that drives a data line of an electro-optical panel. For example, an input resistor of the electro-optical panel corresponds to the resistor RP, and a parasitic capacitor and a pixel capacitor of the data line correspond to the capacitor CP.

The amplifier circuit 150 is an arithmetic amplifier, and is configured as a voltage follower circuit. In other words, an inverted input terminal of the amplifier circuit 150 is coupled to an output terminal, and the output terminal is coupled to the output node NVQ, and a non-inverted input terminal is coupled to an output node NVAI of the voltage output circuit 110.

The voltage output circuit 110 outputs, to the output node NVAI, an output voltage VAI corresponding to a D/A conversion voltage of input data DI. The voltage output circuit 110 basically subjects the input data DI to D/A conversion, and outputs the result as the output voltage VAI. The voltage output circuit 110 temporarily overdrives the output voltage VAI at predetermined timing.

Figure 2:
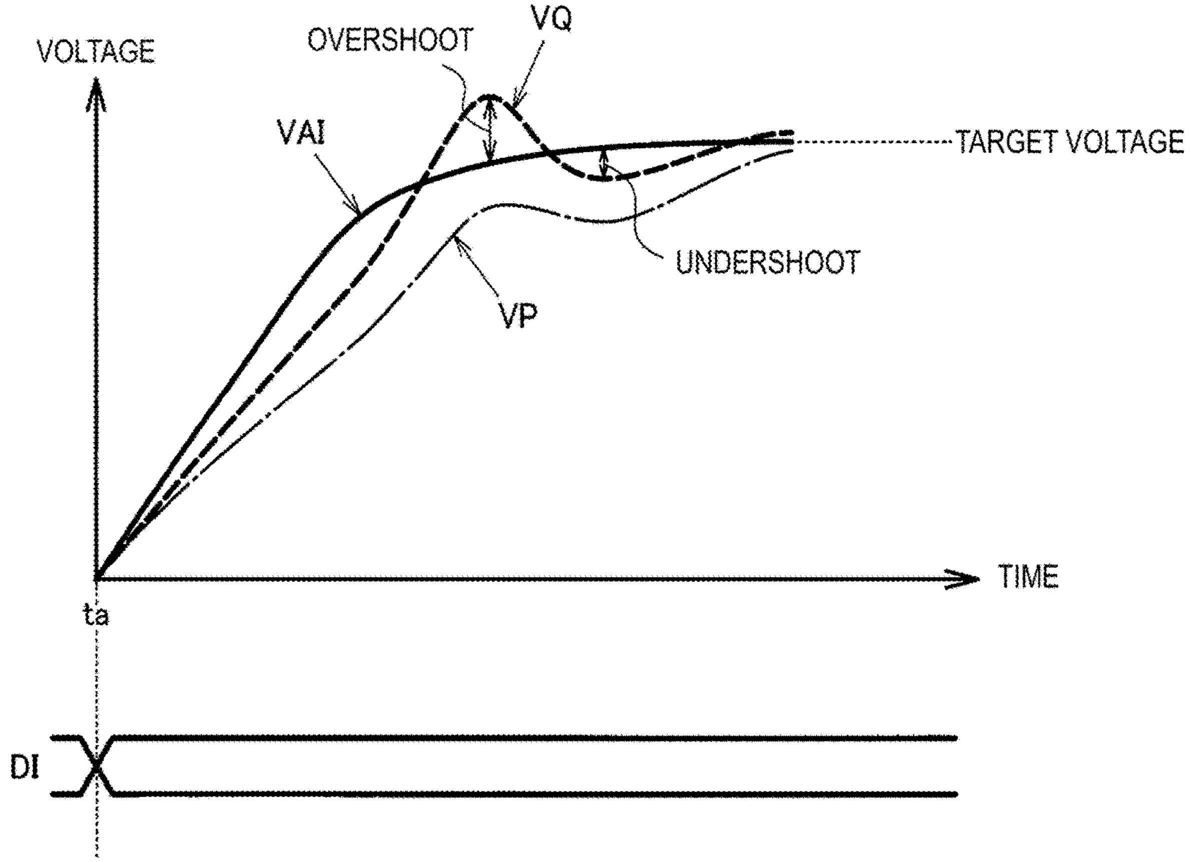
FIG. 2 illustrates a signal waveform example when overdrive of the present embodiment is not applied.

Hereinafter, an operation of the circuit device 100 is described with reference to signal waveform examples. First, for the sake of comparison, description is made on a signal waveform example when overdrive of the present embodiment is not applied, with reference to FIG. 2. As illustrated in FIG. 2, at a time ta, the value of the input data DI is changed. Herein, an example in which the input data DI is changed in a direction in which the output voltage VAI of the voltage output circuit 110 is raised is given.

The output voltage VAI of the voltage output circuit 110 starts to change from the time ta, and gradually approaches a target voltage corresponding to the input data DI. The amplifier circuit 150 raises a driving voltage VQ in response to the raised output voltage VAI of the voltage output circuit 110. The amplifier circuit 150 changes the output in response to the voltage difference of the differential input, and hence raises the driving voltage VQ with a slight delay relative to the raised output voltage VAI of the voltage output circuit 110. When the output voltage VAI of the voltage output circuit 110 approaches the target voltage, and the rise becomes gradually, the driving voltage VQ overshoots the output voltage VAI of the voltage output circuit 110. When the voltage difference of the differential input is equal to or greater than a certain extent due to the overshoot, the driving voltage VQ is lowered in response thereto. With this, the driving voltage VQ undershoots the output voltage VAI of the voltage output circuit 110. The repetition of such overshoots and undershoots is referred to as a ringing. As such ringing converges, the driving voltage VQ converges to the target voltage.

The driving voltage VQ charges the capacitor CP via the resistor RP of the capacitive load 1. With this, as the driving voltage VQ converges to the target voltage, a voltage VP of the capacitor CP converges to the target voltage. In general, the convergence speed is an extent of a time constant of the resistor RP and the capacitor CP. As a method of speeding up the convergence time of the voltage VP, there is a method of accelerating charging of the capacitor CP by temporarily raising the driving voltage VQ above the target voltage. The overshoot in the ringing can accelerate charging of the capacitor CP, but the undershoot acts to hinder charging of the capacitor CP, and lowers the voltage VP of the capacitor CP. In other words, convergence to the target voltage is delayed due to ringing.

Figure 3:
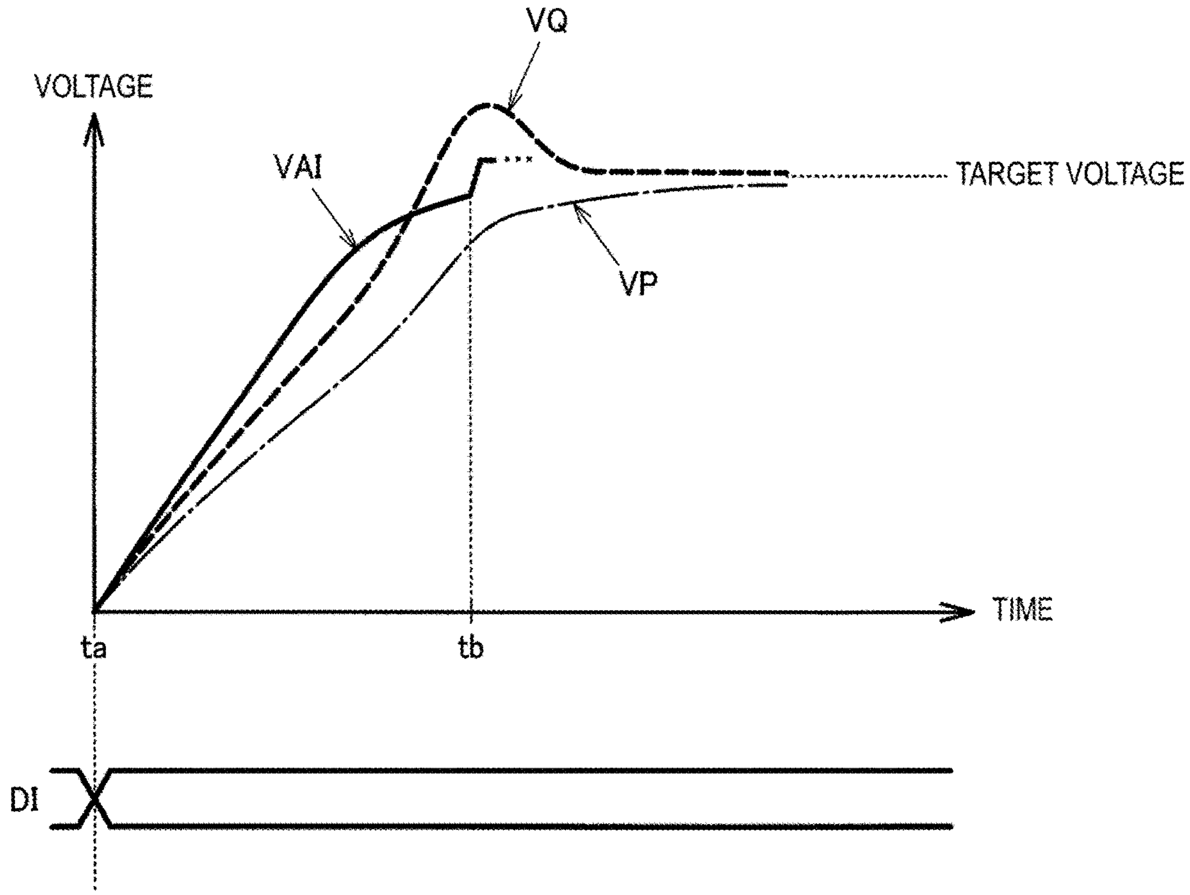
FIG. 3 illustrates a signal waveform example in the present embodiment.

FIG. 3 illustrates a signal waveform example in the present embodiment. The voltage output circuit 110 overdrives the output voltage VAI at a time tb after the time ta. In other words, the voltage output circuit 110 raises the output voltage VAI above the D/A conversion voltage of the input data DI at the time tb. The time tb is timing at which the driving voltage VQ first overshoots. The time tb may be any timing as long as it falls within an overshoot period directly after the driving voltage VQ first overshoots and directly before the driving voltage VQ first undershoots in FIG. 2. In one example, the time tb is, but not limited to, near the peak of the first overshoot.

The voltage output circuit 110 overdrives the output voltage VAI at the time tb, and then returns the output voltage VAI to the D/A conversion voltage of the input data DI. The returning method may be varied, including a gradual manner, a stepwise manner, and the like. Note that an interval between the time ta and the time tb may be set in a freely selective manner. For example, the interval may be set in a register or a non-transitory memory, which is omitted in illustration. The interval between the time ta and the time tb may be determined in advance through a circuit simulation, a sample evaluation, or the like.

According to the present embodiment, when the driving voltage VQ overshoots, the voltage output circuit 110 temporarily overdrives the output voltage VAI. With this, the voltage difference of the differential input of the amplifier circuit 150 can be reduced. With this, the undershoot after the overshoot can be eliminated or reduced. The overshoot of the driving voltage VQ accelerates charging of the capacitor CP of the capacitive load 1, and hindering of charging due to the undershoot thereafter is eliminated or reduced. Thus, the capacitive load 1 can be driven at a high speed.

Note that, when the input data DI is changed in a direction in which the output voltage VAI of the voltage output circuit 110 is lowered, the driving voltage VQ first undershoots. In this state, overdriving is to lower the output voltage VAI below the D/A conversion voltage of the input data DI. In other words, the voltage output circuit 110 lowers the output voltage VAI below the D/A conversion voltage of the input data DI at the time tb, and then returns the output voltage VAI to the D/A conversion voltage of the input data DI.

In the present embodiment, the circuit device 100 includes the amplifier circuit 150 and the voltage output circuit 110. The output terminal of the amplifier circuit 150 is coupled to the inverted input terminal. The amplifier circuit 150 outputs the driving voltage VQ to the capacitive load 1. The voltage output circuit 110 outputs, to the non-inverted input terminal of the amplifier circuit 150, the output voltage VAI corresponding to the D/A conversion voltage of the input data DI. The voltage output circuit 110 raises the output voltage VAI above the D/A conversion voltage when the driving voltage VQ overshoots the D/A conversion voltage due to a change of the input data DI in a positive direction.

According to the present embodiment, when the driving voltage VQ overshoots the D/A conversion voltage of the input data DI, the voltage output circuit 110 can overdrive in a direction in which the output voltage VAI is temporarily raised. With this, the voltage difference of the differential input of the amplifier circuit 150 is reduced, and hence the undershoot after the overshoot can be eliminated or reduced. In a case in which the input data DI is changed in the positive direction, when the undershoot occurs, charging of the capacitive load 1 is hindered. However, according to the present embodiment, the undershoot is eliminated or reduced, and hence the capacitive load 1 can be driven at a high speed.

Further, in the present embodiment, the voltage output circuit 110 raises the output voltage VAI above the D/A conversion voltage, and then returns the output voltage VAI to the D/A conversion voltage.

According to the present embodiment, the output voltage VAI that is input to the non-inverted input terminal of the amplifier circuit 150 is returned to the D/A conversion voltage of the input data DI after the overdrive. With this, the driving voltage VQ converges to the target voltage corresponding to the input data DI.

Further, in the present embodiment, the voltage output circuit 110 changes the output voltage VAI with a delay relative to a change timing of the input data DI.

As illustrated in FIG. 2 and FIG. 3, the output voltage VAI starts to change when the input data DI is changed, and the driving voltage VQ overshoots the output voltage VAI when the change of the output voltage VAI becomes gradual. The voltage output circuit 110 changes the output voltage VAI with a delay relative to the change timing of the input data DI. With this, when the driving voltage VQ overshoots, voltage output circuit 110 can overdrive the output voltage VAI.

Further, in the present embodiment, when the driving voltage VQ undershoots the D/A conversion voltage due to a change of the input data DI in a negative direction, the voltage output circuit 110 lowers the output voltage VAI below the D/A conversion voltage.

According to the present embodiment, when the driving voltage VQ undershoots the D/A conversion voltage of the input data DI, the voltage output circuit 110 can overdrives to temporarily lower the output voltage VAI. With this, the voltage difference of the differential input of the amplifier circuit 150 is reduced, and hence the overshoot after the undershoot can be eliminated or reduced. In a case in which the input data DI is changed in the negative direction, when the overshoot of the driving voltage VQ occurs, charging of the capacitive load 1 is hindered. However, according to the present embodiment, the overshoot is eliminated or reduced, and hence the capacitive load 1 can be driven at a high speed.

2. Second Configuration Example

Figure 4:
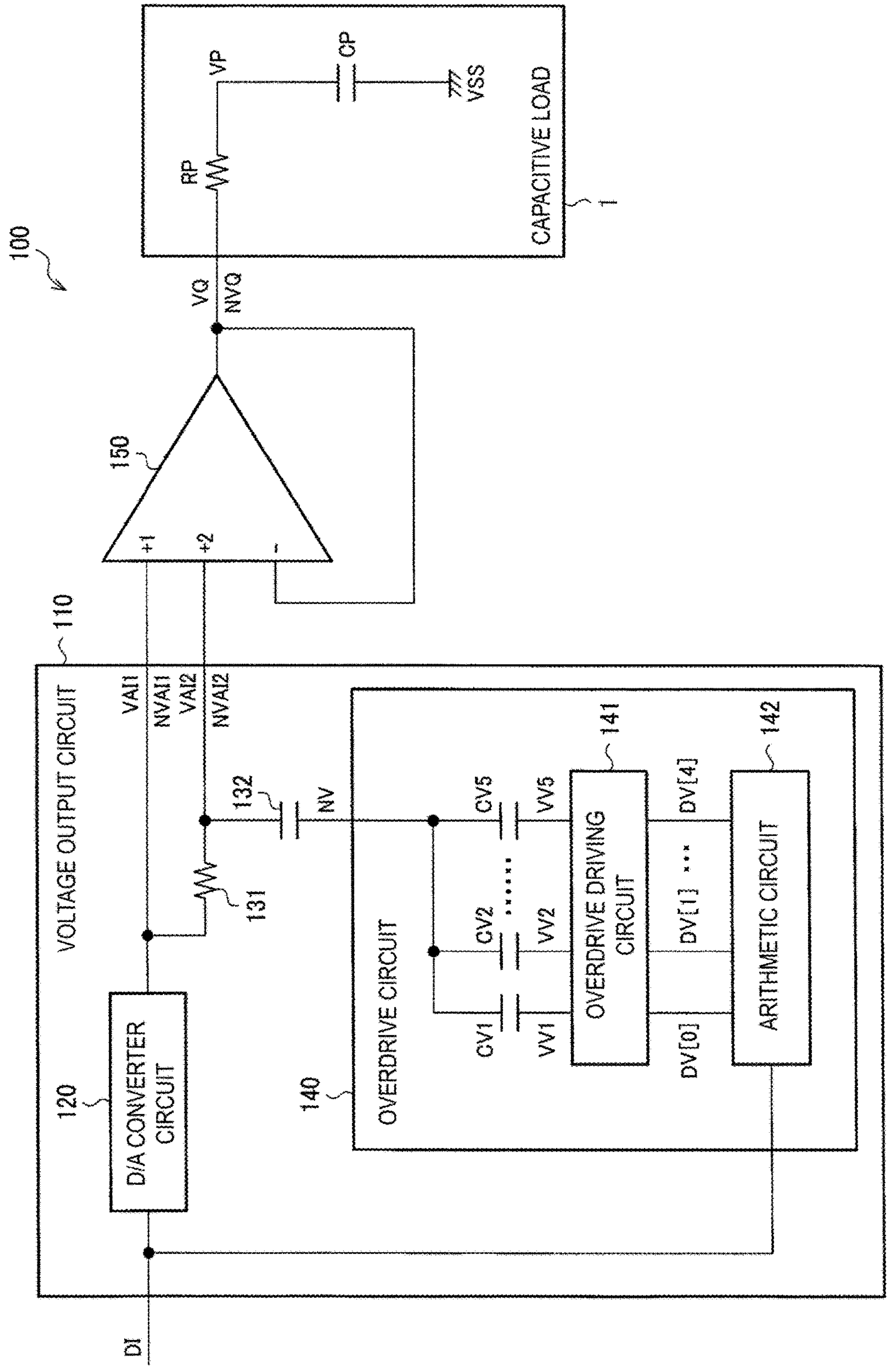
FIG. 4 illustrates a second configuration example of the circuit device.

FIG. 4 illustrates a second configuration example of the circuit device. The circuit device 100 includes the voltage output circuit 110 and the amplifier circuit 150. Hereinafter, differences from FIG. 1 are mainly described.

The voltage output circuit 110 includes a D/A converter circuit 120, an overdrive circuit 140, a resistor 131, and a capacitor 132. The voltage output circuit 110 includes a first output node NVAI1 and a second output node NVAI2, and those correspond to the output node NVAI in FIG. 1.

The D/A converter circuit 120 subjects the input data DI to D/A conversion, and outputs the result as a D/A conversion voltage VAI1 to the first output node NVAI1. For example, the D/A converter circuit 120 includes a ladder resistor circuit that generates a plurality of voltages corresponding to the respective values of the input data DI and a selector circuit that selects a voltage corresponding to the input data DI from the plurality of voltages. The voltages selected by the selector circuit is output as the D/A conversion voltage VAI1. However, the configuration of the D/A converter circuit 120 is not limited thereto.

One end of the resistor 131 is coupled to the first output node NVAI1, and the other end is coupled to the second output node NVAI2. One end of the capacitor 132 is coupled to the second output node NVAI2, and the other end is coupled to a first node NV. The input data DI is input to the overdrive circuit 140, and the output of the overdrive circuit 140 is coupled to the first node NV.

The amplifier circuit 150 includes a first non-inverted input terminal indicated by "+1" and a second non-inverted input terminal indicated by "+2". The first non-inverted input terminal is coupled to the first output node NVAI1, and the second non-inverted input terminal is coupled to the second output node NVAI2. By using those two non-inverted input terminals, the input voltage of the amplifier circuit 150 on the non-inverted side is a voltage between the D/A conversion voltage VAI1 of the first output node NVAI1 and a voltage VAI2 of the second output node NVAI2.

The overdrive circuit 140 changes the voltage VAI2 of the second output node NVAI2 by driving the first node NV, based on the difference between the current input data DI and the previous input data DI. The previous input data DI indicates the input data DI directly before the current input data DI among the input data DI input in a chronological order. When the overdrive circuit 140 drives the first node NV, the input voltage of the amplifier circuit 150 on the non-inverted side is changed from the D/A conversion voltage VAI1, in other words, the input voltage of the amplifier circuit 150 on the non-inverted side is overdriven.

The overdrive circuit 140 includes overdrive capacitors CV1 to CV5, an overdrive driving circuit 141, and an arithmetic circuit 142. Note that the number of overdrive capacitors is not limited to 5, and may be m. m is an integer equal to or greater than 2.

The arithmetic circuit 142 acquires overdrive data DV[4:0] from the input data DI. Specifically, the arithmetic circuit 142 acquires the overdrive data DV[4:0], based on the difference between the current input data DI and the previous input data DI. The bit number of the overdrive data is not limited to 5, and may be m.

One end of the overdrive capacitor CVq is couple to the first node NV. q=1, 2, . . . , 5 is given. The capacitance value is expressed by $CVq=CV1\times 2^{(q-1)}$. The overdrive driving circuit 141 outputs an overdrive voltage WVq to the other end of the overdrive capacitor CVq, based on a bit DV[q−1]. When DV[q−1] is at a low level, WVq is a low potential-side power voltage. When DV[q−1] is at a high level, WVq is a high potential-side power voltage. For example, the overdrive driving circuit 141 includes a buffer circuit that subjects the bit DV[q−1] to buffering and outputs the resultant as the overdrive voltage VVq. The overdrive driving circuit 141 changes the overdrive voltages VV1 to VV5, based on the overdrive data DV[4:0]. With this, a charge is supplied from the overdrive capacitors CV1 to CV5 to the first node NV, or a charge is discharged from the first node NV to the overdrive capacitors CV1 to CV5. With this, the voltage VAI2 of the second output node NVAI2 changes.

Figure 5:
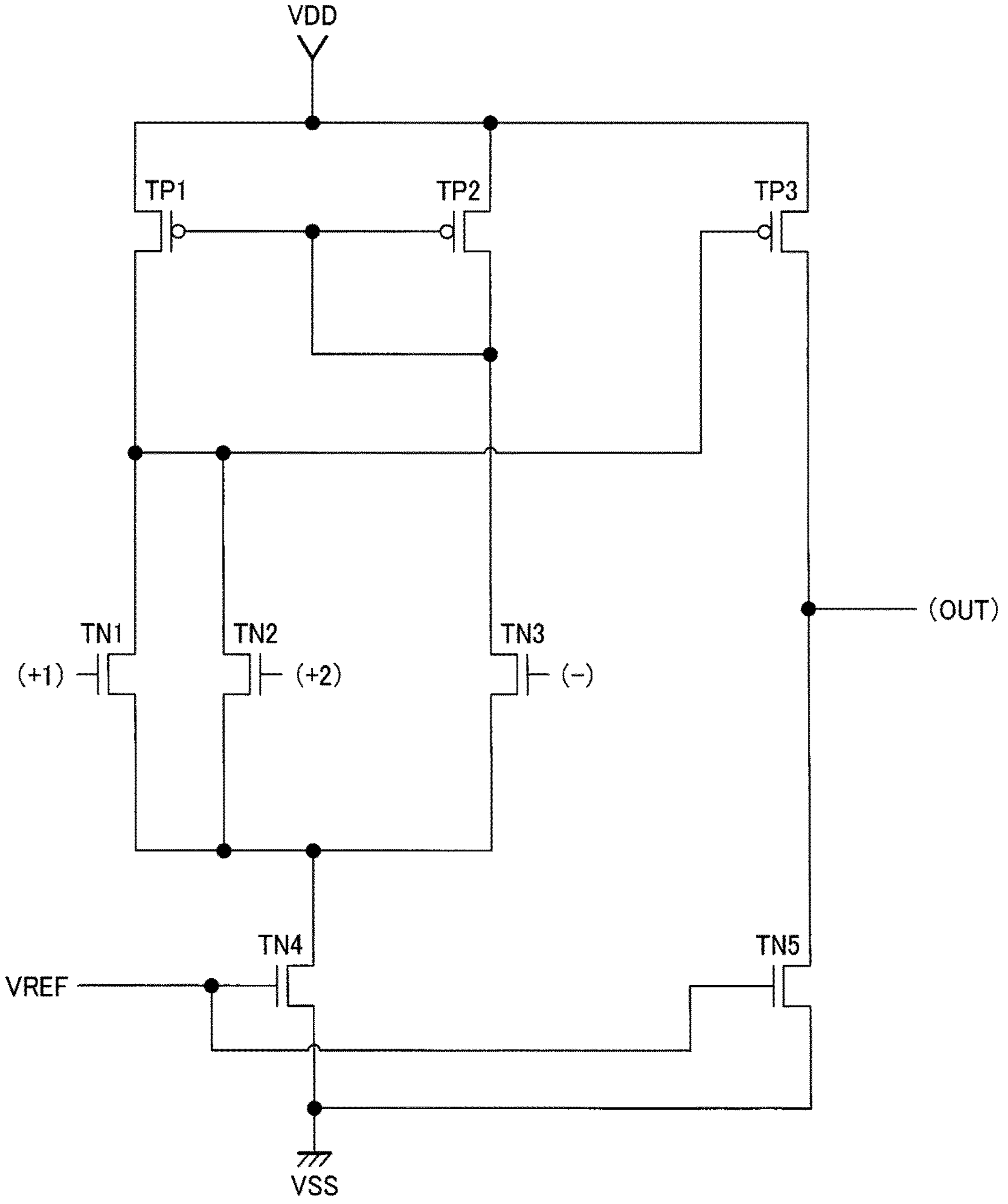
FIG. 5 illustrates a detailed configuration example of an amplifier circuit in the second configuration example of the circuit device.

FIG. 5 illustrates a detailed configuration example of the amplifier circuit in the second configuration example of the circuit device. The amplifier circuit 150 includes P-type transistors TP1 to TP3 and N-type transistors TN1 to TN5. Note that (+1) indicates the first non-inverted input terminal, (+2) indicates the second non-inverted input terminal, (−) indicates the inverted input terminal, and (OUT) indicates the output terminal. VDD indicates the high potential-side power voltage, and VSS indicates the low potential-side power voltage.

The P-type transistors TP1 and TP2 form a current mirror circuit, and acts as a load of a differential pair. The N-type transistors TN1 and TN2 are transistors of the differential pair on the non-inverted input side, and the N-type transistor TN3 is a transistor of the differential pair on the inverted input side. The gate of the N-type transistor TN1 is coupled to the first non-inverted input terminal, and the gate of the N-type transistor TN2 is coupled to the second non-inverted input terminal. The N-type transistor TN4 is a power source of the differential pair, and a bias voltage VREF is input to the gate thereof. The P-type transistor TP3 is a transistor of the output stage, and the output voltage of the differential pair is input to the gate thereof. The N-type transistor TN5 is a power source of the output stage, and the bias voltage VREF is input to the gate thereof.

Figure 6:
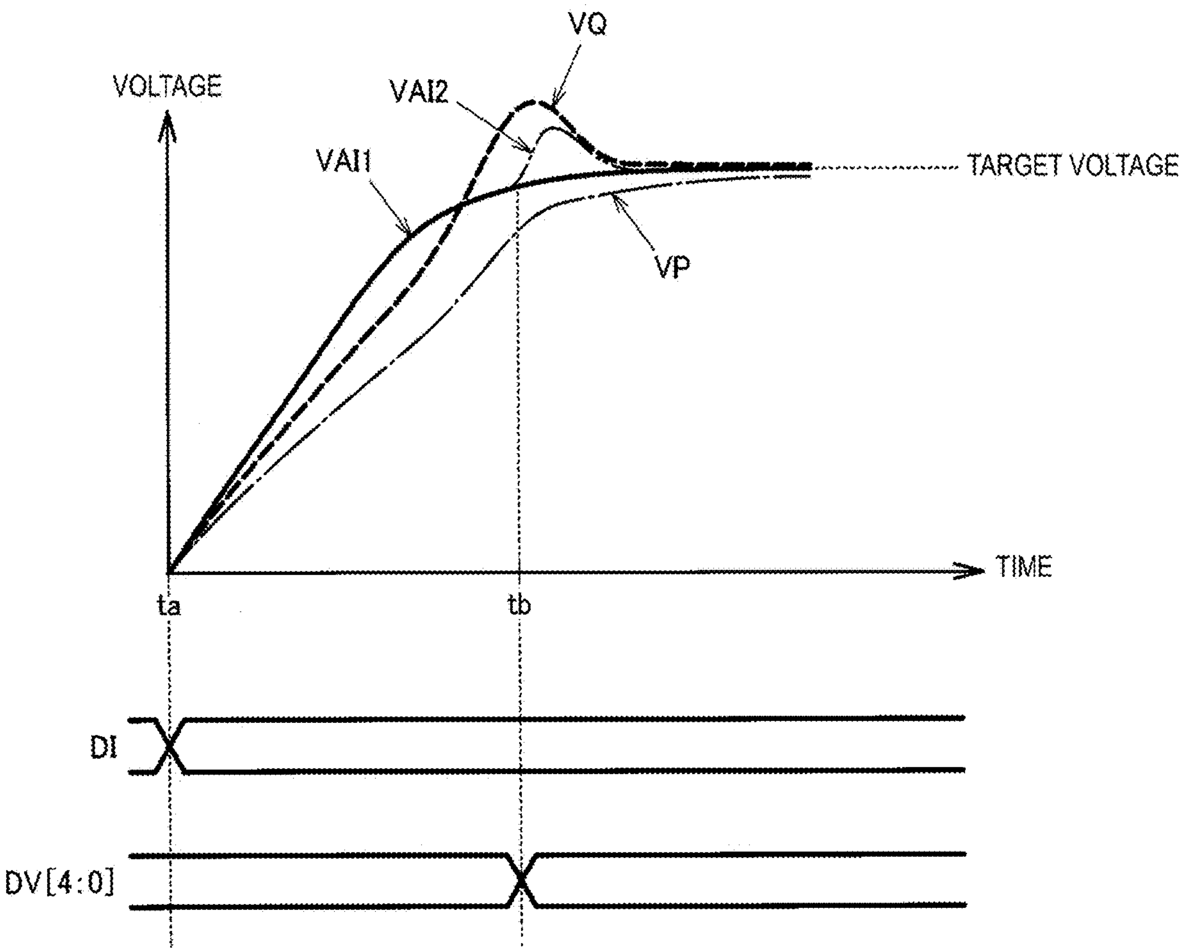
FIG. 6 illustrates a signal waveform example in the second configuration example of the circuit device.

FIG. 6 illustrates a signal waveform example in the second configuration example of the circuit device. The arithmetic circuit 142 changes the value of the overdrive data DV[4:0] at the time tb after the driving voltage VQ first overshoots. With this, the voltage VAI2 is higher than the D/A conversion voltage VAI1. The voltage VAI2 in this state is also referred to as an overdrive voltage. The second output node NVAI2 is coupled to the first output node NVAI1 via the resistor 131. Thus, the voltage VAI2 is gradually lowered, and converges to the D/A conversion voltage VAI1. The time constant at which the overdrive converges is determined by the resistance value of the resistor 131, the capacitance value of the capacitor 132, and the capacitance values of the overdrive capacitors CV1 to CV5. When the time constant is set to an extent similar to the time constant of the capacitive load 1, a time during which the driving voltage VQ higher than the target voltage is lowered to the target voltage and a time during which the overdrive converges to the target voltage can be set to a similar extent. With this, the undershoot of the driving voltage VQ can be eliminated or reduced, and the driving time of the capacitive load 1 can be sped up.

Note that when the input data DI is changed in a direction in which the D/A conversion voltage VAI1 is lowered, the driving voltage VQ first undershoots. In this state, the arithmetic circuit 142 changes the value of the overdrive data DV[4:0] so that the voltage VAI2 is lowered below the D/A conversion voltage VAI1 at the time tb.

Figure 7:
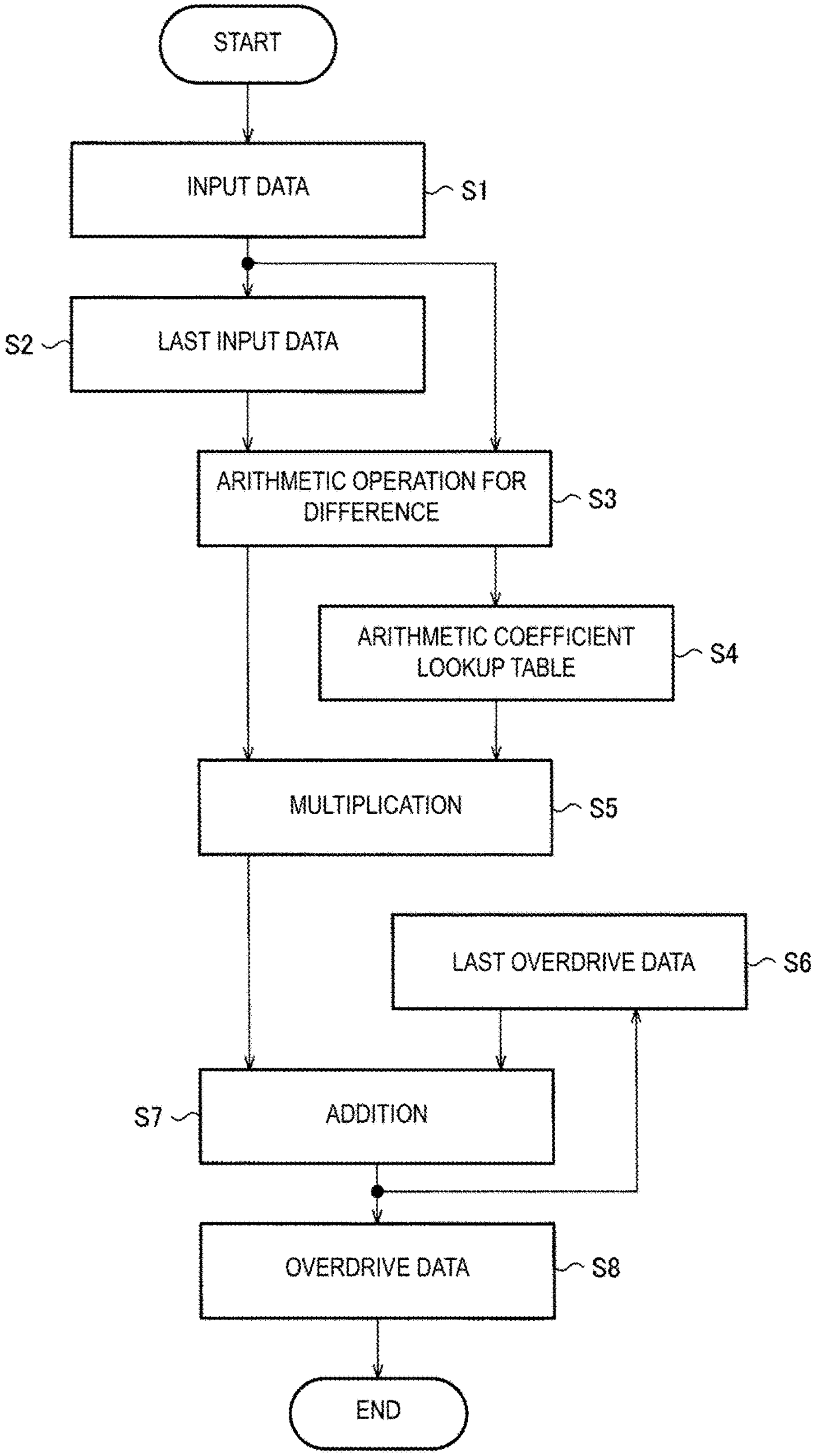
FIG. 7 illustrates a processing flow executed by an arithmetic circuit in the second configuration example of the circuit device.

FIG. 7 illustrates a flow of processing executed by the arithmetic circuit in the second configuration example of the circuit device. In Step S1, the arithmetic circuit 142 acquires the input data DI. In Step S2, the arithmetic circuit 142 acquires the last input data DI stored in a memory, a register, or the like. In Step S3, the arithmetic circuit 142 executes an arithmetic operation to acquire the difference between the input data DI acquired in Step S1 and the last input data DI acquired in Step S2.

In Step S4, an arithmetic coefficient lookup table is referred to, based on the difference, and an arithmetic coefficient is acquired. The arithmetic coefficient lookup table is a table for outputting an arithmetic coefficient with respect to the difference being input. For example, the arithmetic coefficient lookup table is stored in a memory or a register, and may be set from the outside via an interface, which is omitted in illustration. Note that, regardless of the difference, a constant arithmetic coefficient may be used. In Step S5, the arithmetic circuit 142 multiplies the arithmetic coefficient to the difference. Note that, for example, when the arithmetic coefficient is ½, the multiplication of the arithmetic coefficient may be substantially achieved by dividing the difference by 2.

In Step S6, the arithmetic circuit 142 acquires the last overdrive data DV[4:0] that is stored in a memory, a register, or the like. In Step S7, the arithmetic circuit 142 acquires the current overdrive data DV[4:0] by adding the multiplication result in Step S5 to the last overdrive data DV[4:0]. Note that, when the difference is negative, the multiplication result in Step S5 is negative. In this state, the addition of the multiplication result may be substantially achieved by subtracting the absolute value of the multiplication result from the last overdrive data DV[4:0]. In Step S8, the arithmetic circuit 142 outputs the overdrive data DV[4:0] acquired in Step S7.

Figure 8:
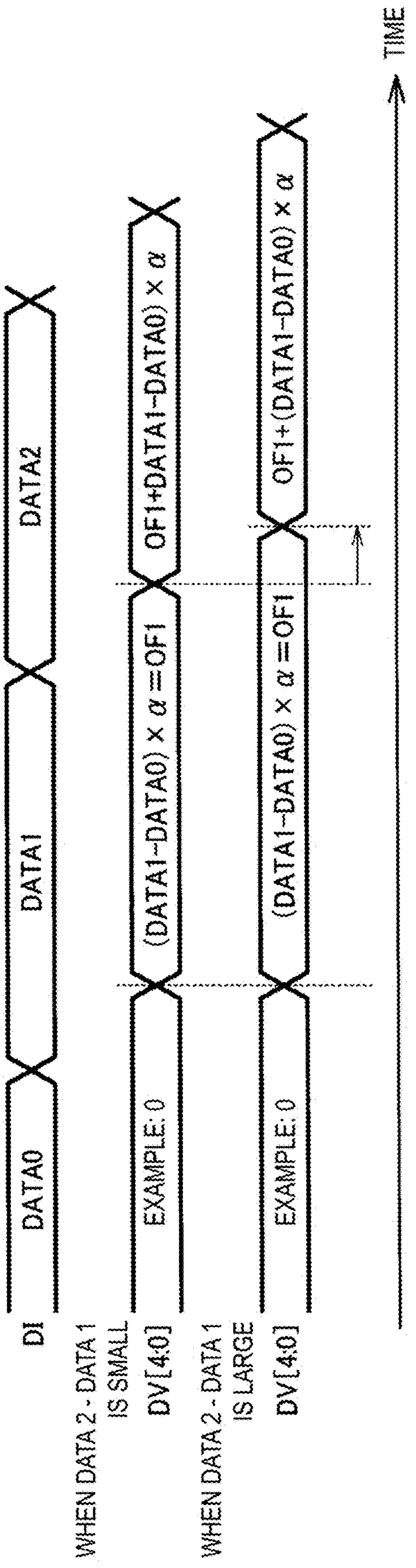
FIG. 8 illustrates a content of an arithmetic operation executed by the arithmetic circuit and a timing chart in the second configuration example of the circuit device.

FIG. 8 illustrates a content of the arithmetic operation executed by the arithmetic circuit and a timing chart in the second configuration example of the circuit device. DATA 0, DATA 1, and DATA 2 are chronologically input as the input data DI to the arithmetic circuit 142. Herein, the initial value of the overdrive data DV[4:0] is 0, but the initial value is not limited to 0.

When DATA 1 is input, the arithmetic circuit 142 executes an arithmetic operation to acquire DV[4:0]=(DATA 1−DATA 0)×$\alpha$. (DATA 1−DATA 0) is the difference between the current input data DI and the last input data. $\alpha$ is an arithmetic coefficient acquired from the arithmetic coefficient lookup table. (DATA 1−DATA 0)×$\alpha$=OF1 is given. The arithmetic circuit 142 changes the overdrive data DV[4:0] with a delay relative to the timing at which the input data DI is change from DATA 0 to DATA 1.

When DATA 2 is input, the arithmetic circuit 142 executes an arithmetic operation to acquire DV[4:0]=OF1+(DATA 2−DATA 1)×$\alpha$. OF1 is the previous overdrive data DV[4:0]. (DATA 2−DATA 1) is the difference between the current input data DI and the last input data. $\alpha$ is an arithmetic coefficient acquired from the arithmetic coefficient lookup table. Thereafter, a similar arithmetic operation is executed. The arithmetic circuit 142 changes the overdrive data DV[4:0] with a delay relative to the timing at which the input data DI is changed from DATA 1 to DATA 2. In this state, the change timing of DV[4:0] in a case in which (DATA 2−DATA 1) is small is delayed relative to the change timing of DV[4:0] in a case in which (DATA 2−DATA 1) is great.

Figure 9:
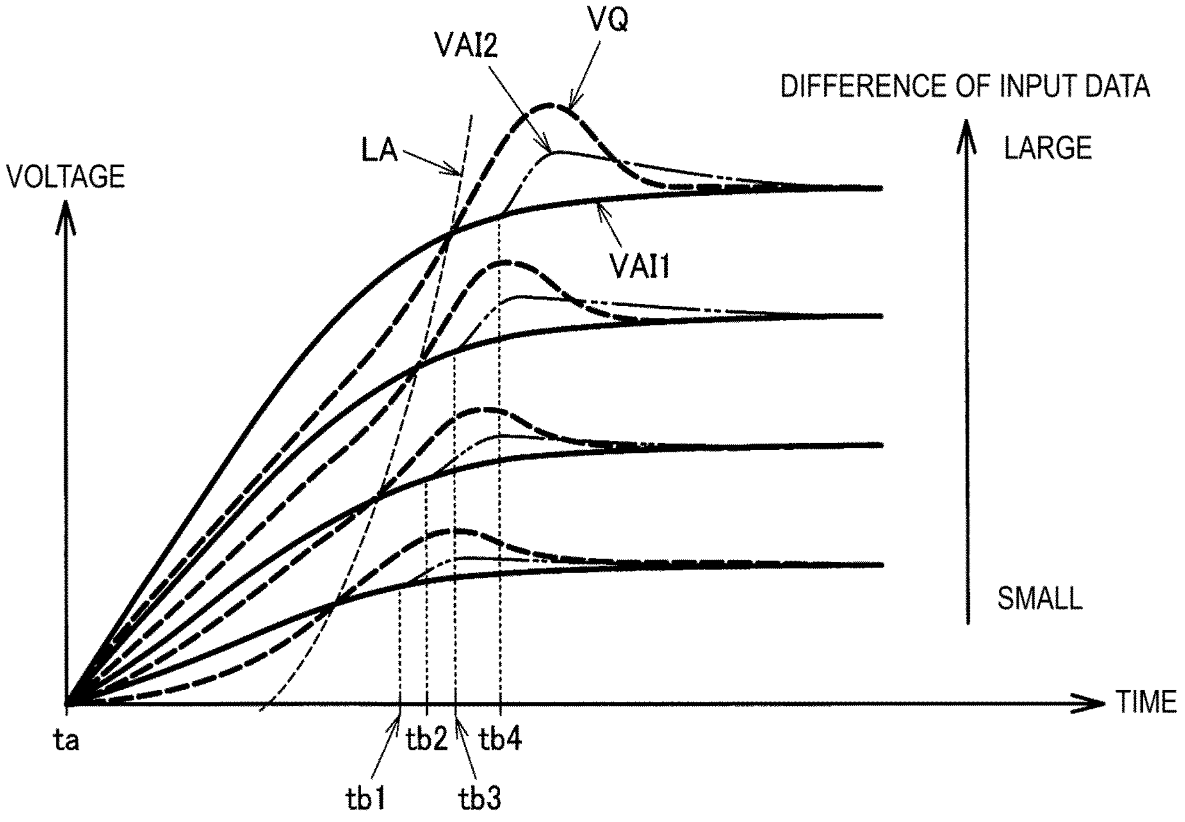
FIG. 9 is a diagram for describing timing of the overdrive.

FIG. 9 is a diagram for describing timing of the overdrive. FIG. 9 illustrates a signal waveform example when the difference between the previous input data DI and the current input data is changed.

The Line LA indicates timing at which the driving voltage VQ overshoots the D/A conversion voltage VAI1. As indicated with the Line LA, as the difference of the input data DI is increased, the overshoot timing is delayed. Thus, the arithmetic circuit 142 delays the overdrive timing as the difference of the input data DI is greater. Specifically, it is assumed that, when the difference of the input data DI is a first value to a fourth value, times for changing the overdrive data DV[4:0] are denoted by tb1, tb2, tb3, and tb4, respectively. When the first value<the second value<the third value<the fourth value is given, tb1<tb2<tb3<tb4 is satisfied.

For example, the arithmetic circuit 142 refers to a timing setting lookup table to determine the time tb. The timing setting lookup table is a table in which the difference between the previous input data DI and the current input data is an input and the time tb is an output. For example, the timing setting lookup table may be stored in a memory or a register, and may be set from the outside via an interface circuit, which is omitted in illustration.

In the present embodiment, the voltage output circuit 110 changes a time from the change timing of the input data DI to the change timing of the output voltage VAI, in accordance with the difference between the previous input data DI and the current input data DI.

As illustrated in FIG. 8 and FIG. 9, as the difference between the previous input data DI and the current input data DI is greater, the timing at which the driving voltage VQ overshoots the D/A conversion voltage of the input data DI is delayed more. According to the present embodiment, the voltage output circuit 110 changes the change timing of the output voltage VAI in accordance with the difference. With this, when the driving voltage VQ overshoots, the voltage output circuit 110 can overdrives the output voltage VAI.

Further, in the present embodiment, the amplifier circuit 150 includes the first non-inverted input terminal and the second non-inverted input terminal as the non-inverted input terminal. The voltage output circuit 110 includes the D/A converter circuit 120, the resistor 131, the capacitor 132, and the overdrive circuit 140. The D/A converter circuit 120 subjects the input data DI to D/A conversion, and outputs the D/A conversion voltage VAI1 to the first non-inverted input terminal. The resistor 131 is provided between the output node NVAI1 of the D/A converter circuit 120 and the second non-inverted input terminal. The capacitor 132 is provided between the second non-inverted input terminal and the first node NV. The overdrive circuit 140 drives the first node NV, based on the input data DI. With this, the voltage of the second non-inverted input terminal is set to the overdrive voltage higher than the D/A conversion voltage VAI1.

According to the present embodiment, the overdrive circuit 140 drives the first node NV, based on the input data DI, and then the voltage VAI2 of the second non-inverted input terminal of the amplifier circuit 150 is changed via the capacitor 132. With this, the voltage of the amplifier circuit 150 on the non-inverted input side is overdriven. The resistor 131 is provided between the output node NVAI1 of the D/A converter circuit 120 and the second non-inverted input terminal. With this, the voltage VAI2 of the second non-inverted input terminal that is overdriven gradually returns to the D/A conversion voltage of the input data DI.

Further, in the present embodiment, the overdrive circuit 140 includes the arithmetic circuit 142, first to m overdrive capacitors CV1 to CVm, and the overdrive driving circuit 141. The arithmetic circuit 142 executes an arithmetic operation to acquire the overdrive data DV[4:0] corresponding to the overdrive voltage, based on the input data DI. One end of each of the first to m overdrive capacitors CV1 to CVm is coupled to the first node NV. The overdrive driving circuit 141 drives the other end of each of the first to m overdrive capacitors CV1 to CVm, based on the overdrive data DV[4:0].

According to the present embodiment, the overdrive driving circuit 141 drives the other end of each of the first to m overdrive capacitors CV1 to CVm. With this, the voltage VAI2 of the second non-inverted input terminal of the amplifier circuit 150 is changed via the first to m overdrive capacitors CV1 to CVm and the capacitor 132. With this, the voltage of the amplifier circuit 150 on the non-inverted input side is overdriven. Further, the arithmetic circuit 142 executes an arithmetic operation to acquire the overdrive data DV[4:0]. With this, the overdrive voltage can be changed.

Further, in the present embodiment, the arithmetic circuit 142 multiplies the coefficient to the difference between the previous input data DI and the current input data DI, and outputs the overdrive data DV[4:0] by using the multiplication result.

According to the present embodiment, an arithmetic operation is executed to acquire the overdrive data DV[4:0] in accordance with the difference between the previous input data DI and the current input data DI. Thus, the voltage output circuit 110 can output the overdrive voltage in accordance with the difference.

Further, in the present embodiment, the arithmetic circuit 142 multiplies the coefficient to the difference, the coefficient differing in accordance with the difference.

According to the present embodiment, the arithmetic circuit 142 multiplies the coefficient to the difference, the coefficient differing in accordance with the difference. With this, the overdrive voltage suitable for the overshoot of the driving voltage VQ can be generated.

3. Third Configuration Example

Figure 10:
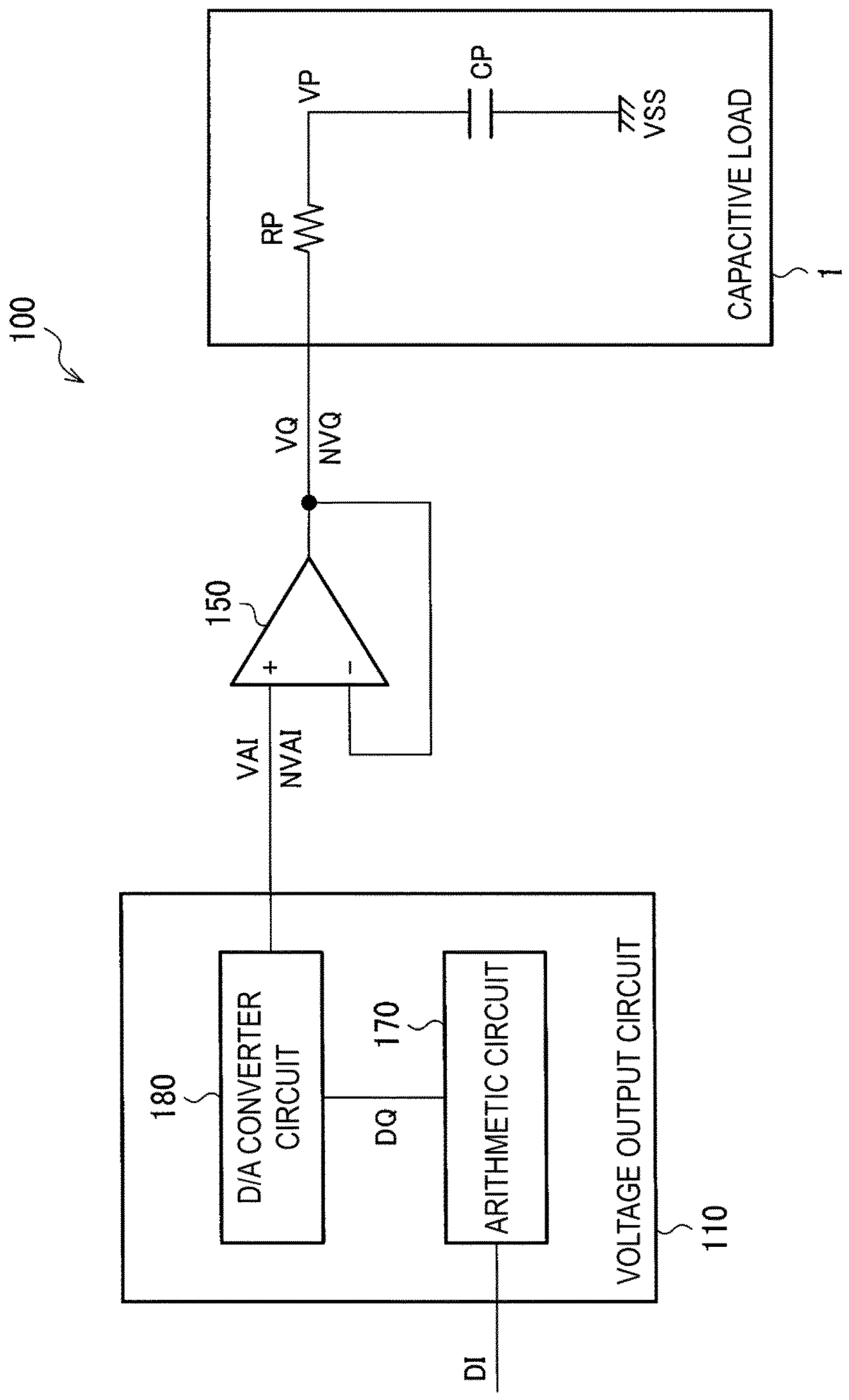
FIG. 10 illustrates a third configuration example of the circuit device.

FIG. 10 illustrates a third configuration example of the circuit device. The circuit device 100 includes the voltage output circuit 110 and the amplifier circuit 150. Hereinafter, differences from FIG. 1 are mainly described. The voltage output circuit 110 includes a D/A converter circuit 180 and an arithmetic circuit 170.

The arithmetic circuit 170 outputs the output data DO, based on the input data DI. The arithmetic circuit 170 basically outputs the output data DO having the same value as the input data DI. the arithmetic circuit 170 changes the output data DO from the input data DI at predetermined timing. After that, the arithmetic circuit 170 returns the output data DQ to the input data DI. For example, the arithmetic circuit 170 returns the output data DO to the input data DI stepwisely, gradually, or directly.

The D/A converter circuit 180 subjects the output data DQ to D/A conversion, and the result is output as the output voltage VAI to the output node NVAI. For example, the D/A converter circuit 180 includes a ladder resistor circuit that generates a plurality of voltages corresponding to the respective values of the input data DI and a selector circuit that selects a voltage corresponding to the input data DI from the plurality of voltages. The voltages selected by the selector circuit is output as the output voltage VAI. However, the configuration of the D/A converter circuit 180 is not limited thereto.

Figure 11:
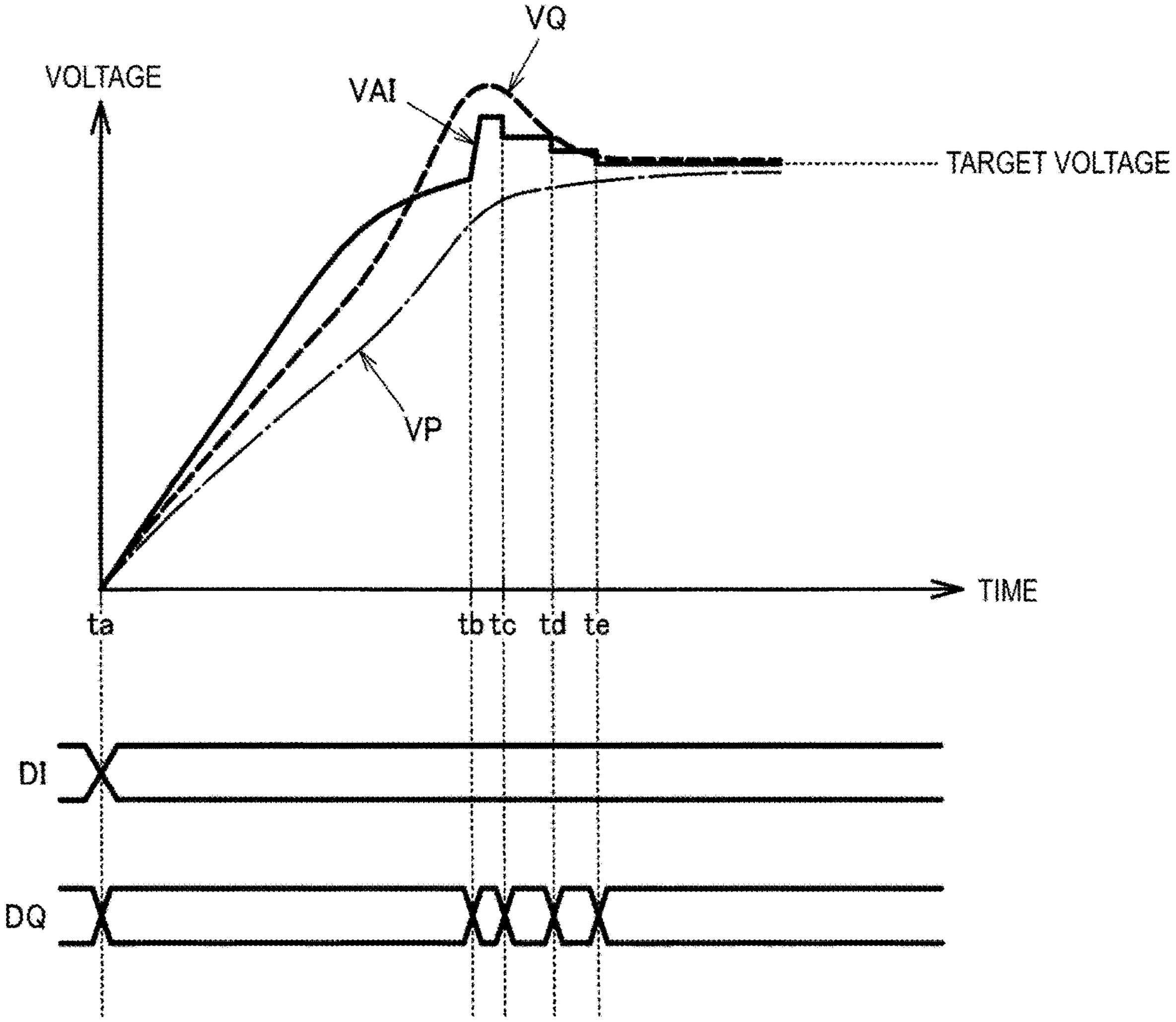
FIG. 11 illustrates a signal waveform example in the third configuration example of the circuit device.

FIG. 11 illustrates a signal waveform example in the third configuration example of the circuit device. Hereinafter, description is made on an example in which the arithmetic circuit 170 changes the output data DO stepwisely.

The arithmetic circuit 170 outputs the output data DQ having the same value as the input data DI, from the time ta to the time tb. The time tb is a time after the driving voltage VQ first overshoots. The arithmetic circuit 170 changes the output data DQ to a value greater than the input data DI, at the time tb. The output data DQ is also referred to as first output data. With this, the output voltage VAI of the D/A converter circuit 180 is higher than the D/A conversion voltage of the input data DI. The arithmetic circuit 170 reduces the output data DO stepwisely at a time tc and a time td after the time tb. The output data DQ is also referred to as second output data and third output data. The arithmetic circuit 170 changes the output data DQ to the value same as the input data DI at a time the after the time td. With this, the output voltage VAI of the D/A converter circuit 180 returns to the D/A conversion voltage of the input data DI. A time during which the output voltage VAI is increased and then returns to the D/A conversion voltage of the input data DI is set to an extent similar to the time constant of the capacitive load 1. With this, a time during which the driving voltage VQ higher than the target voltage is lowered to the target voltage and a time during which the overdrive converges to the target voltage can be set to a similar extent. With this, the undershoot of the driving voltage VQ can be eliminated or reduced, and the driving time of the capacitive load 1 can be sped up.

Note that, when the input data DI is changed in a direction in which the D/A conversion voltage of the input data DI is lowered, the driving voltage VQ first undershoots. In this state, the arithmetic circuit 170 changes the output data DQ to a value less than the input data DI at the time tb. After that, the arithmetic circuit 170 stepwisely raises the output data DO to the input data DI.

Figure 12:
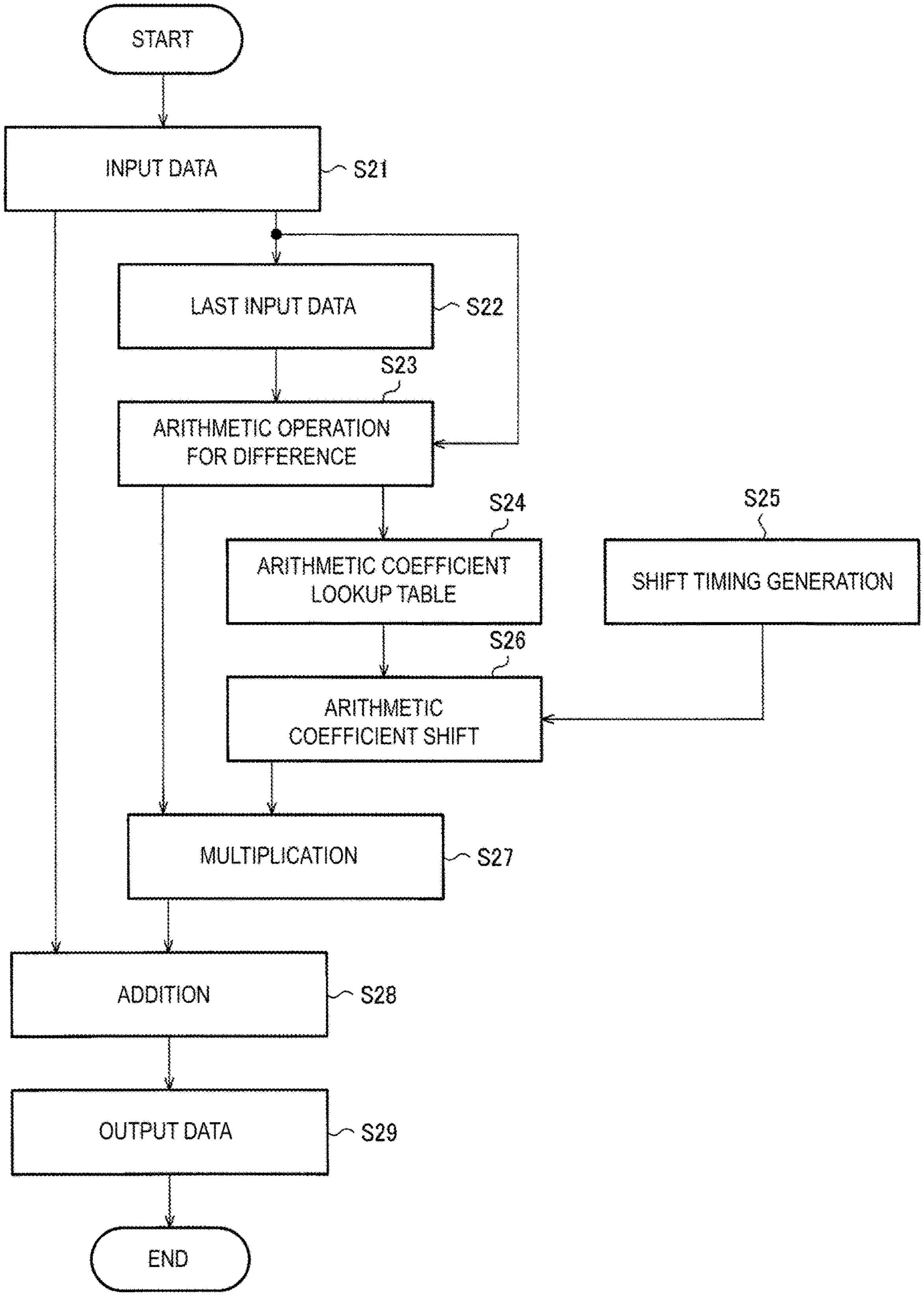
FIG. 12 illustrates a processing flow executed by an arithmetic circuit in the third configuration example of the circuit device.

FIG. 12 illustrates a processing flow executed by the arithmetic circuit in the third configuration example of the circuit device. In Step S21, the arithmetic circuit 170 acquires the input data DI. In Step S22, the arithmetic circuit 170 acquires the last input data DI stored in a memory, a register, or the like. In Step S23, the arithmetic circuit 170 executes an arithmetic operation to acquire the difference between the input data DI acquired in Step S21 and the last input data DI acquired in Step S22.

In Step S24, the arithmetic coefficient lookup table is referred to, based on the difference, and the arithmetic coefficient is acquired. The arithmetic coefficient lookup table is a table for outputting an arithmetic coefficient with respect to the difference being input. For example, the arithmetic coefficient lookup table is stored in a memory or a register, and may be set from the outside via an interface, which is omitted in illustration. Note that, regardless of the difference, a constant arithmetic coefficient may be used.

In Step S25, the arithmetic circuit 170 generates shift timing at which the value of the output data DQ is changed. For example, the shift timing corresponds to the times tb, tc, td, and the in FIG. 11. In Step S26, at each shift timing, the arithmetic circuit 170 shifts the arithmetic coefficient. It is assumed that the arithmetic coefficient acquired in Step S24 is β. In one example, at the times tb, tc, td, and te, the arithmetic circuit 170 executes an arithmetic operation with β×1, β×½, and β×¼ as coefficients. This corresponds to a shift of β to the LSB side by one bit. The arithmetic circuit 170 executes an arithmetic operation with β×0 as a coefficient at the time te. Note that a method of changing the coefficient is not limited to the above-mentioned shift arithmetic operation as long as the coefficient is reduced stepwisely.

In Step S27, the arithmetic circuit 170 multiplies the coefficient acquired in Step S26 to the difference acquired in Step S23. Note that, for example, when the coefficient is ½, the multiplication of the coefficient may be substantially achieved by dividing the difference by 2.

In Step S28, the arithmetic circuit 170 adds the multiplication result in Step S27 to the input data DI acquired in Step S21. With this, the output data DQ is acquired. Note that, when the difference is negative, the multiplication result in Step S27 is negative. In this state, the addition of the multiplication result may be substantially achieved by subtracting the absolute value of the multiplication result from the input data DI. In Step S29, the arithmetic circuit 170 outputs the output data DO acquired in Step S28.

Figure 13:
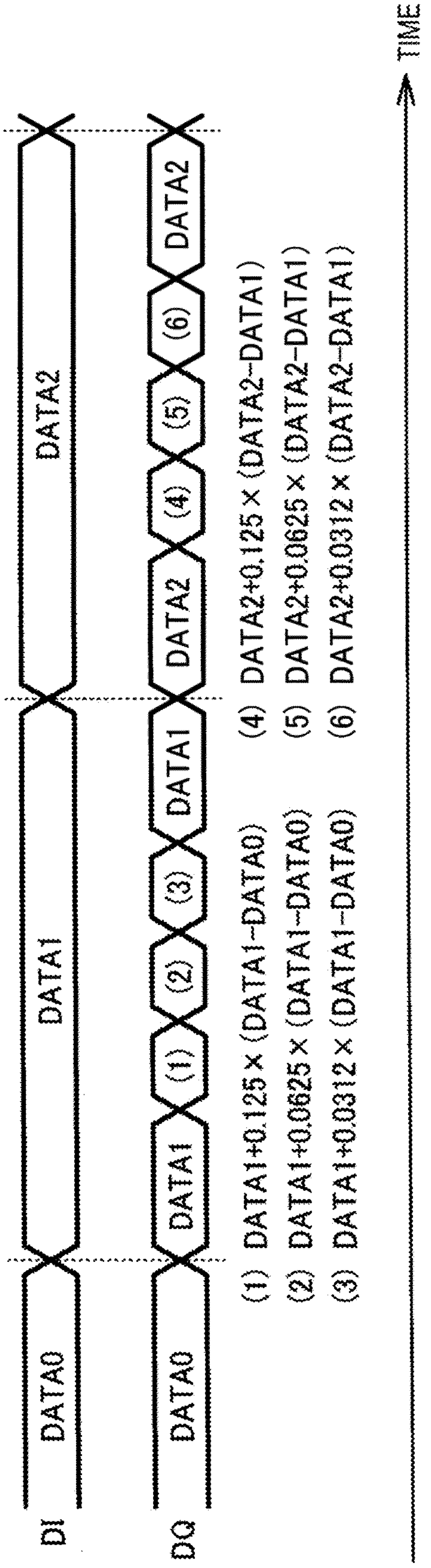
FIG. 13 illustrates a content of an arithmetic operation executed by the arithmetic circuit and a timing chart in the third configuration example of the circuit device.

FIG. 13 illustrates a content of an arithmetic operation executed by the arithmetic circuit and a timing chart in the third configuration example of the circuit device. DATA 0, DATA 1, and DATA 2 are chronologically input as the input data DI to the arithmetic circuit 170.

When DATA 1 is input, the arithmetic circuit 170 outputs DATA 1 as the output data DQ. After that, the arithmetic circuit 170 outputs the output data DQ indicated in (1), (2), and (3). The coefficient multiplied to the difference (DATA 1−DATA 0) is shifted in the order of 0.125, 0.125/2=0.0625, 0.125/4=0.0312. After that, the arithmetic circuit 170 changes the output data DO to DATA 1. The same applies when DATA 2 is input to the arithmetic circuit 170. Expressions of the output data DQ are given in (4), (5), and (6).

Note that, as illustrated in FIG. 8 and FIG. 9, as the difference of the input data DI is increased, the overshoot timing is delayed. Thus, as the difference of the input data DI is increased, the arithmetic circuit 170 delays the time tb at which the overdrive is started. With this, the times tc, td, and the are also delayed.

In the present embodiment, the voltage output circuit 110 includes the arithmetic circuit 170 and the D/A converter circuit 180. The arithmetic circuit 170 executes an arithmetic operation to acquire the output data DQ, based on the input data DI. The D/A converter circuit 180 subjects the output data DQ to D/A conversion, and then outputs the output voltage VAI. The arithmetic circuit 170 changes the output data DQ from the input data DI to the first output data for raising the output voltage VAI above the D/A conversion voltage of the input data DI.

According to the present embodiment, the arithmetic circuit 170 changes the output data DO from the input data DI to the first output data. With this, the output voltage VAI of the D/A converter circuit 180 is change to a voltage higher than the D/A conversion voltage of the input data DI. With this, the voltage VAI that is input to the non-inverted input terminal of the amplifier circuit 150 is overdriven.

Further, in the present embodiment, the arithmetic circuit 170 changes the output data DO to the first output data, and then returns the output data DO to the input data DI.

According to the present embodiment, the voltage VAI of the second non-inverted input terminal that is overdriven returns to the D/A conversion voltage of the input data DI.

Further, in the present embodiment, the arithmetic circuit 170 multiplies the coefficient to the difference between the previous input data DI and the current input data DI, and outputs the first output data by using the multiplication result.

According to the present embodiment, an arithmetic operation is executed to acquire the first output data in accordance with the difference between the previous input data DI and the current input data DI. Thus, the D/A converter circuit 180 can output the overdrive voltage in accordance with the difference.

Further, in the present embodiment, the arithmetic circuit 170 multiplies the coefficient to the difference, the coefficient differing in accordance with the difference.

According to the present embodiment, the arithmetic circuit 170 multiplies the coefficient to the difference, the coefficient differing in accordance with the difference. With this, the overdrive voltage suitable for the overshoot of the driving voltage VQ can be generated.

4. Fourth Configuration Example

Figure 14:
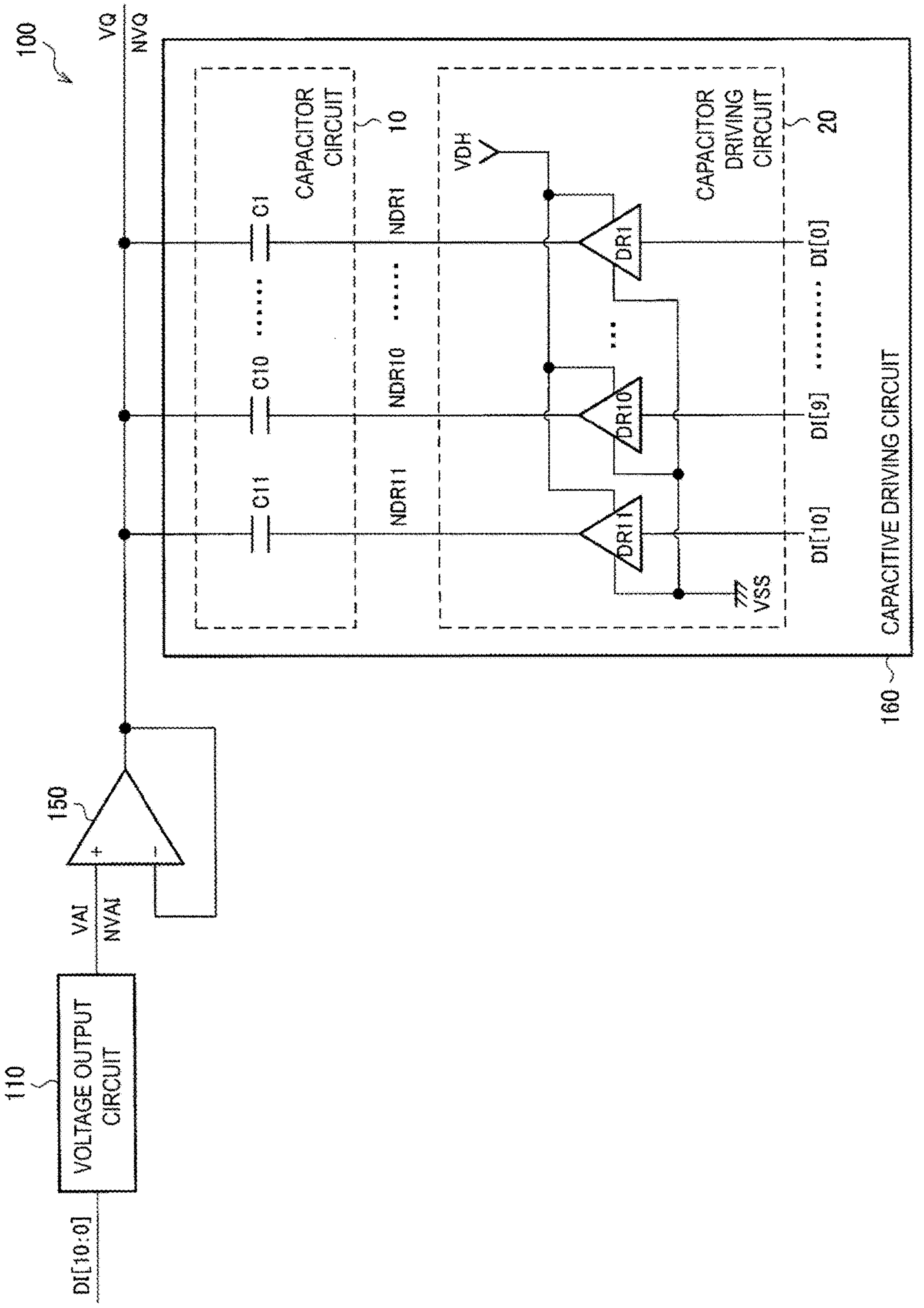
FIG. 14 illustrates a fourth configuration example of the circuit device.

FIG. 14 illustrates a fourth configuration example of the circuit device. The circuit device 100 includes the voltage output circuit 110, the amplifier circuit 150, and a capacitive driving circuit 160. The constituent elements described above are denoted with the same reference symbols, and description for the constituent elements is omitted. FIG. 14 illustrates an example acquired by adding the capacitive driving circuit 160 to the first configuration example of the circuit device 100. However, the capacitive driving circuit 160 may be added to the second or third configuration example.

The capacitive driving circuit 160 drives the capacitive load 1 through capacitive driving. The capacitive driving circuit 160 includes a capacitor circuit 10 and a capacitor driving circuit 20.

The capacitor circuit 10 includes first to n capacitors C1 to Cn. The capacitor driving circuit 20 includes first to n driving circuits DR1 to DRn. Description is made below on an example in which n=11 is given. However, n may be an integer equal to or greater than 2.

One end of the capacitor Ci is coupled to the output node NVQ, and the other end is coupled to a capacitor driving node NDRi. i is an integer that is equal to or greater than 1 and satisfies n=11 or less. The capacitors C1 to C11 have capacitance values weighted in binary. Specifically, the capacitance value of the capacitor Ci is $2^{(i-1)}\times C1$.

It is assumed that the number of bits of the input data is n=11, which is represented as DI[10:0]. The i-th bit DI[i−1] of the input data DI[10:0] is input to the input node of the driving circuit DRi. The driving circuit DRi outputs, to the capacitor driving node NDRi, a first voltage level when the bit DI[i−1] is a first logic level, and outputs, to the capacitor driving node NDRi, a second voltage level when the bit DI[i−1] is a second logic level. For example, the first logic level is a low level, the second logic level is a high level, the first voltage level is the low potential-side voltage, and the second voltage level is the high potential-side voltage. For example, the i-th driving circuit DRi includes a level shifter that shifts the input logic level to an output voltage level of the driving circuit DRi and a buffer circuit that buffers the output of the level shifter.

The driving circuits DR1 to DR11 drive the capacitors C1 to C11. With this, charge re-distribution occurs between the capacitors C1 to C11 and the capacitor CP of the capacitive load 1. Further, as a result, the driving voltage VQ corresponding to the input data DI[10:0] is output to the output node NVQ.

It is assumed that the total of the capacitance values of the capacitors C1 to C11 is Ctot=C1+C2+ . . . +C11. In one example, it is assumed that the output amplitude of the amplifier circuit 150 is 10 V and the high potential-side power voltage is 15 V. In this state, the capacitance values of the capacitors C1 to C11 are set so that Ctot/CP=2 is satisfied. The amplitude of the driving voltage VQ through capacitive driving is $15V\times\{Ctot/(Ctot+CP)\}=10V$. Thus, the amplitude of capacitive driving and the output amplitude of the amplifier circuit 150 are the same.

The capacitive driving circuit 160 is provided. With this, the driving voltage VQ can be changed at high speed through charge re-distribution, and the capacitive load 1 can be driven at high speed. However, a charge is supplied at an extremely high speed due to the time constant of the capacitive load 1. With this, the ringing of the driving voltage VQ may be significant, and the driving time of the capacitive load 1 may be prolonged. In such a case, the driving time of the capacitive load 1 can also be reduced by overdriving the output voltage VAI when the voltage output circuit 110 first overshoots or first undershoots.

5. Electro-Optical Device

Figure 15:
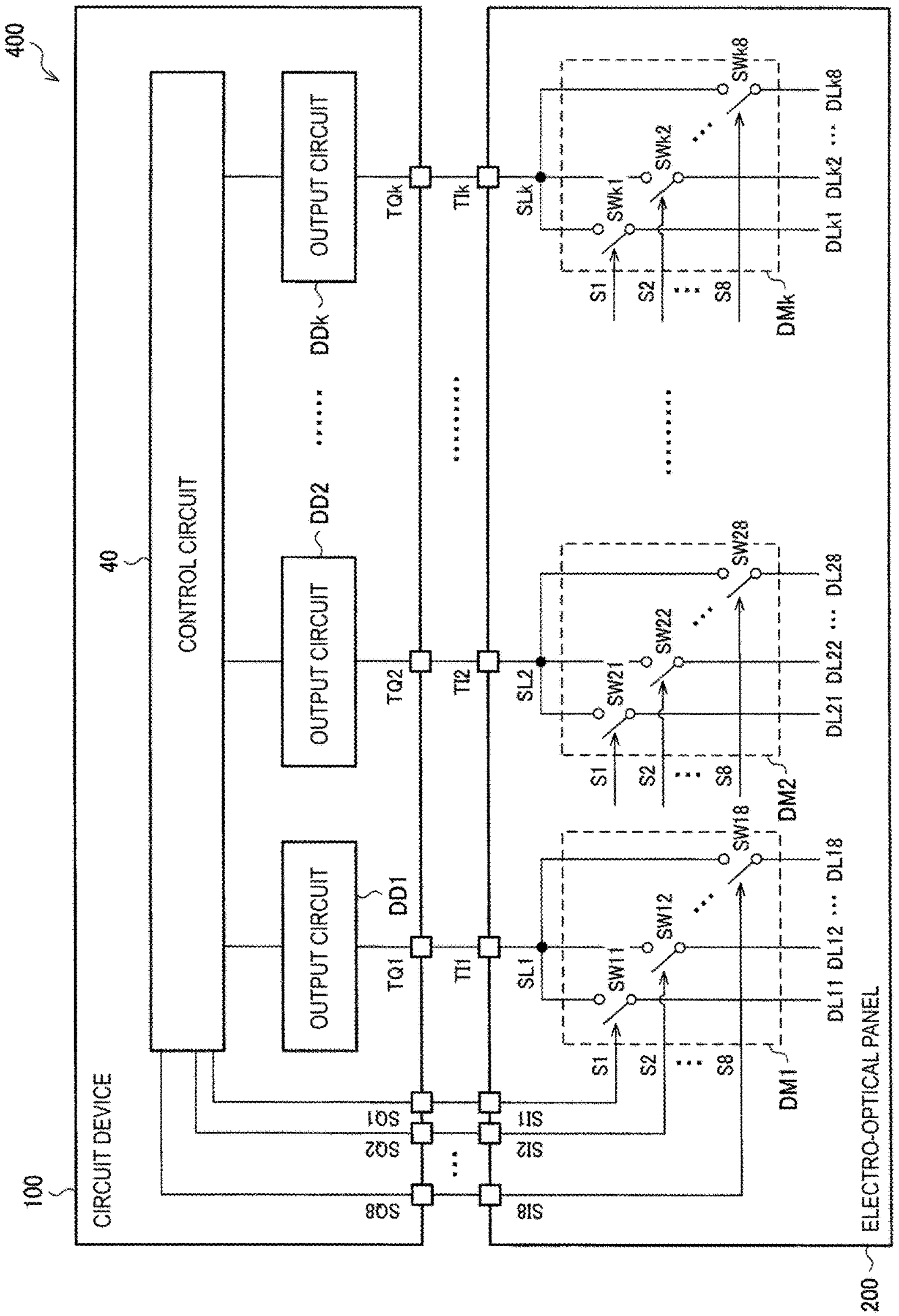
FIG. 15 illustrates a configuration example of an electro-optical device.

An example in which the circuit device 100 is used as a driver of an electro-optical device is given below. FIG. 15 illustrates a configuration example of the electro-optical device. An electro-optical device 400 includes the circuit device 100 and an electro-optical panel 200. Description is made below on an example of the electro-optical device 400 of a demultiplex driving type. The electro-optical device 400 is not limited thereto, and may be a phase development driving type, for example. Further, in the following description, an example in which the demultiplex number is eight is given. However, the demultiplex number may be p. p is an integer equal to or greater than 2.

The circuit device 100 includes a control circuit 40, output circuits DD1 to DDk, output terminals TQ1 to Tok, and control signal output terminal SQ1 to SQ8. k is an integer equal to or greater than 2. For example, the circuit device 100 is an integrated circuit device in which a plurality of circuit elements are integrated on a semiconductor substrate.

The electro-optical panel 200 includes input terminals TI1 to TIk, signal supply lines SL1 to SLk, demultiplexers DM1 to DMk, data lines DL11 to DL18, DL21 to DL28, . . . , and DLk1 to DLk8, and control signal input terminals SI1 to SI8. The electro-optical panel 200 is an active matrix type liquid crystal display panel, an EL display panel using a self light-emitting element, or the like. EL is an abbreviation of Electro-Luminescence.

The control circuit 40 outputs, to the output circuit DD1, gradation data as input data. The output circuit DD1 converts the gradation data into a data voltage, and outputs the data voltage to the output terminal TQ1. The output terminal TQ1 is coupled to the input terminal TI1, and the input terminal TI1 is coupled to the signal supply line SL1. The same applies to the output circuits DD2 to DDk, the output terminals TQ2 to TQk, the input terminals TI2 to TIk, and the signal supply lines SL2 to SLk.

The demultiplexer DM1 includes switches SW11 to SW18. Each of the switch is a TFT, for example. TFT is an abbreviation of Thin Film Transistor. One end of the switch SW11 is coupled to the signal supply line SL1, and the other end is coupled to the data line DL11. The switch SW11 is controlled in an on state or an off state by a control signal S1. Similarly, one end of each of the switches SW12 to SW18 is coupled to the signal supply line SL1, and the other ends are coupled to the data lines DL12 to DL18, respectively. The switches SW12 to SW18 are controlled in an on state or an off state by control signals S2 to S8. The same applies to the demultiplexers DM2 to DMk, the switches SW21 to SW28, . . . , and SWk1 to SWk8, and the data lines DL21 to DL28, . . . , and DLk1 to DLk8. The number of switches in each of the demultiplexers and the number of data lines may be p, which is the same as the demultiplex number.

Although omitted in FIG. 15, a plurality of pixels are arranged in a matrix on the electro-optical panel 200. One data line and one scanning line are coupled to one pixel. Note that the scanning line is selected by a scanning line driving circuit, which is omitted in illustration. The scanning line driving circuit may be included in the circuit device 100, or may be provided outside of the circuit device 100.

While giving the output circuit DD1 as an example, demultiplex driving is described. During one horizontal scanning period, the switches SW11, SW12, . . . , and SW18 are sequentially turned on. When the switch SW11 is an on state, the output circuit DD1 writes a data voltage in the pixel coupled to the data line DL11. Similarly, when the switches SW12, . . . , and SW18 are in an on state, the output circuit DD1 writes data voltages in the pixels coupled to the data lines DL12, . . . , and DL1k.

Figure 16:
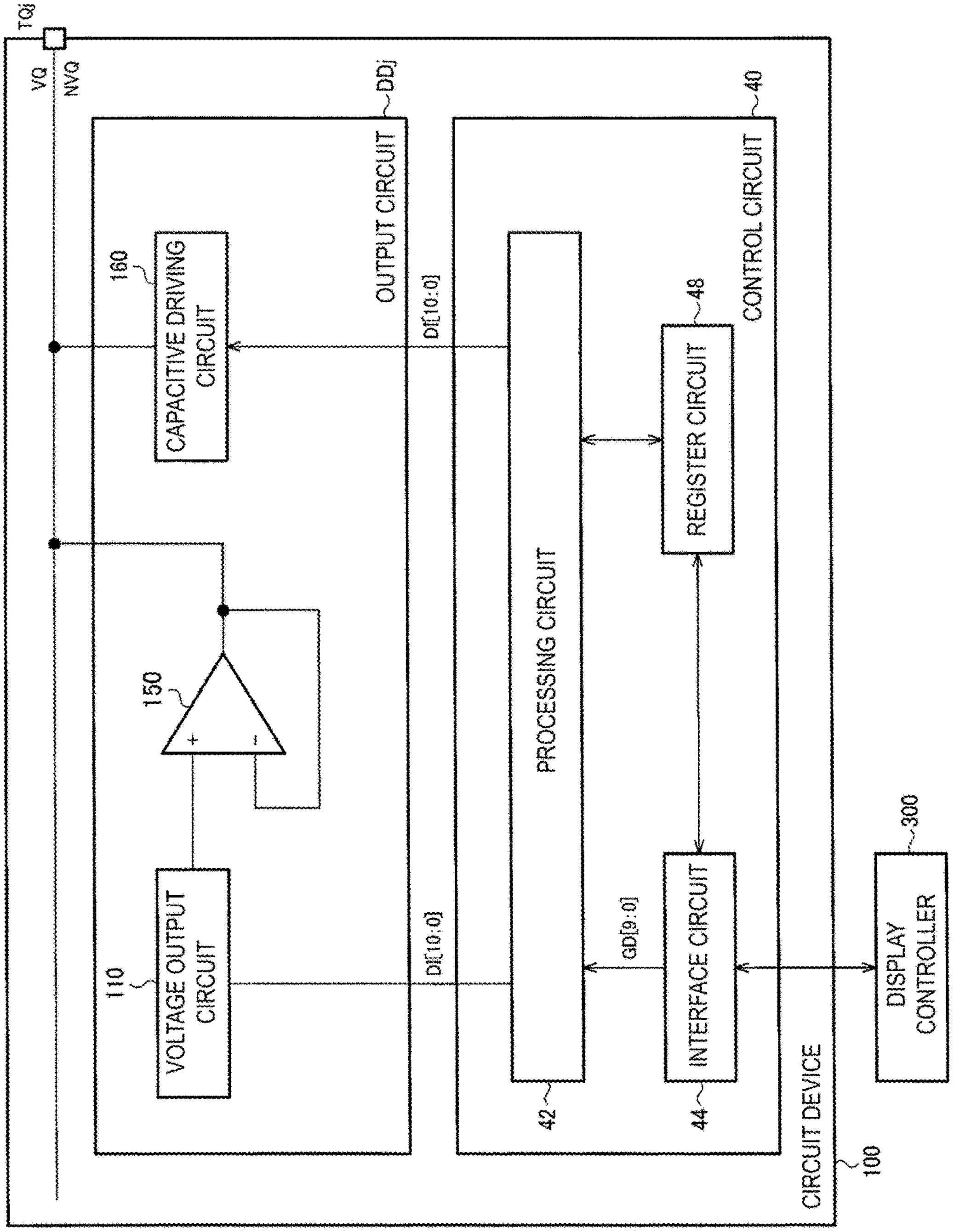
FIG. 16 illustrates a detailed configuration example of the circuit device as a driver.

FIG. 16 illustrates a detailed configuration example of the circuit device as a driver. FIG. 16 illustrates a freely-selected output circuit DDj being one of the output circuit DD1 to DDk and the control circuit 40. j is an integer equal to or greater than 1 and equal to or less than k. The output circuit DDj includes the voltage output circuit 110, the amplifier circuit 150, and the capacitive driving circuit 160. The control circuit 40 includes a processing circuit 42, an interface circuit 44, and a register circuit 48. Note that, herein, an example in which the fourth configuration example of the circuit device is used as the output circuit DDj. The first to third configuration examples may be used as the output circuit DDj.

The interface circuit 44 executes interface processing between a display controller 300 that controls the circuit device 100 and the circuit device 100. The interface circuit 44 outputs, to the processing circuit 42, the gradation data GD[9:0] received from the display controller 300. Note that the number of bits of the gradation data being received may be freely selected. For example, the interface circuit 44 is an image interface circuit of an LVDS type, a parallel RGB type, a display port type, or the like. LVDS is an abbreviation of Low Voltage Differential Signaling.

The processing circuit 42 outputs the input data DI[10:0] as the gradation data, based on the gradation data GD[9:0], to the voltage output circuit 110 and the capacitive driving circuit 160. In one example, it is assumed that a common voltage is 7.5 V, the voltage range of positive polarity driving is 7.5 V to 12.5 V, and the voltage range of negative polarity driving is 7.5 V to 2.5 V. In this state, DI[10:0]=000h corresponds to 2.5 V, DI[10:0]=400h corresponds to 7.5 V, and DI[10:0]=4FFh corresponds to 12.5 V. Note that, when the polarity is not inverted, the gradation data GD[9:0] may be output directly to the voltage output circuit 110 and the capacitive driving circuit 160.

The register circuit 48 stores setting data for setting the time tb at which the overdrive is started. For example, the display controller 300 writes the setting data in the register circuit 48 via the interface circuit 44. Alternatively, the circuit device 100 includes a non-volatile memory that stores the setting data in advance, which is omitted in illustration, and the setting data may be loaded from the non-volatile memory to the register circuit 48. The processing circuit 42 controls the timing of the overdrive by the voltage output circuit 110, based on the setting data that is read from the register circuit 48.

Figure 17:
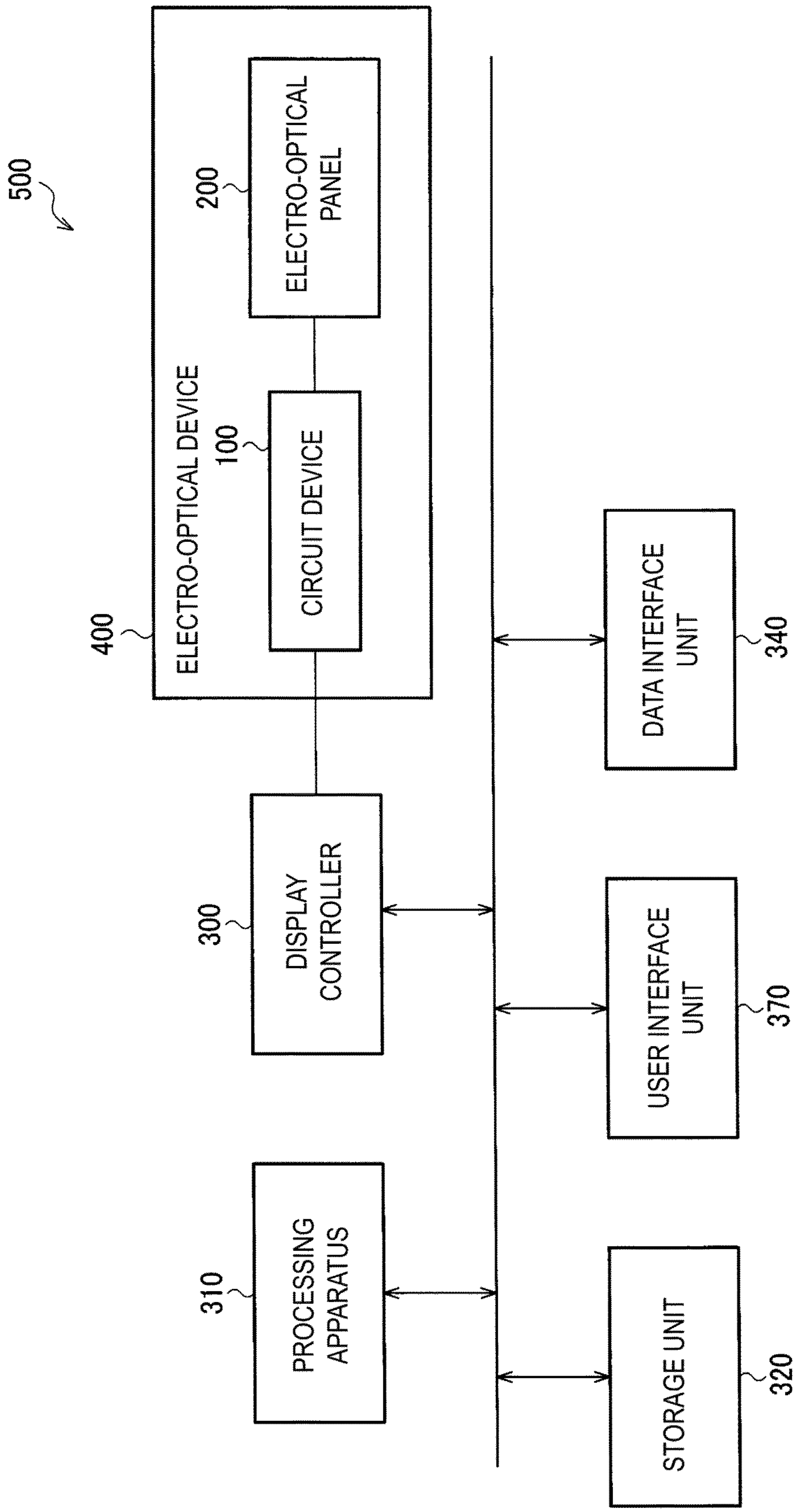
FIG. 17 illustrates a configuration example of an electronic apparatus.

FIG. 17 illustrates a configuration example of an electronic apparatus including the circuit device as a driver. Various electronic apparatus on which display devices are mounted can be contemplated as the electronic apparatus of the embodiment. Examples of the electronic apparatus include a projector, a television apparatus, an information processing apparatus, a portable information terminal, a car navigation system, a portable game terminal, and the like.

The electronic apparatus 500 includes the electro-optical device 400, the display controller 300, a processing device 310, a storage unit 320, a user interface unit 330, and a data interface unit 340. The electro-optical device 400 includes the circuit device 100 and the electro-optical panel 200.

The user interface unit 330 is an interface unit for receiving various operations from a user. For example, the user interface unit 330 is configured by a button, a mouse, a keyboard, or a touch panel mounted to the electro-optical panel 200. The data interface unit 340 is an interface unit for inputting and outputting image data and control data. For example, the data interface unit 340 is a wired communication interface such as a USB or a wireless communication interface such as a wireless LAN. The storage unit 320 stores the image data input from the data interface unit 340. Alternatively, the storage unit 320 serves as a working memory for the processing device 310 or the display controller 300. The processing device 310 executes control processing for each of the units in the electronic apparatus and various data processing. For example, the processing device 310 is a processor such as a CPU and a microcomputer. The display controller 300 executes control processing for the circuit device 100. For example, the display controller 300 converts the image data transferred from the data interface unit 340 or the storage unit 320 into a format receivable in the circuit device 100, and outputs the converted image data to the circuit device 100. The circuit device 100 drives the electro-optical panel 200, based on the image data transferred from the display controller 300.

Note that the circuit device is not limited to a driver, and the electronic apparatus incorporating the circuit device is not limited to the one described above. In other words, the electronic apparatus is only required to include a device corresponding to the capacitive load and the circuit device 100 that drives the capacitive load.

Note that, although the present embodiment is described in detail above, those skilled in the art easily understand that many modifications can be made without substantially departing from novel items and effects of the present disclosure. All such modified examples are thus included in the scope of the disclosure. For example, terms in the description or drawings given even once along with different terms having identical or broader meanings can be replaced with those different terms in all parts of the description or drawings. Further, all combinations of the embodiment and modified examples are also included within the scope of the disclosure. Furthermore, the configurations, operations, and the like of the circuit device, the control circuit, the output circuit, the electro-optical panel, the electro-optical device, the electronic apparatus, and the like are not limited to those described in the embodiment, and various modifications thereof are possible.

What is claimed is:

1. A circuit device comprising:

an amplifier circuit including an output terminal coupled to an inverted input terminal thereof and configured to output a driving voltage to a capacitive load; and a voltage output circuit configured to output, to a non-inverted input terminal of the amplifier circuit, an output voltage corresponding to a D/A conversion voltage of input data, wherein the voltage output circuit raises the output voltage above the D/A conversion voltage when the driving voltage overshoots the D/A conversion voltage due to a change of the input data in a positive direction, wherein the amplifier circuit includes, as the non-inverted input terminal, a first non-inverted input terminal and a second non-inverted input terminal, and the voltage output circuit includes:

a D/A converter circuit configured to perform D/A conversion on the input data and output the D/A conversion voltage to the first non-inverted input terminal;

a resistor provided between an output node of the D/A converter circuit and the second non-inverted input terminal;

a capacitor provided between the second non-inverted input terminal and a first node; and an overdrive circuit configured to drive the first node based on the input data to set a voltage of the second non-inverted input terminal to an overdrive voltage higher than the D/A conversion voltage.

2. The circuit device according to claim 1, wherein the voltage output circuit raises the output voltage above the D/A conversion voltage, and then returns the output voltage to the D/A conversion voltage.

3. The circuit device according to claim 1, wherein the voltage output circuit changes the output voltage with a delay relative to change timing of the input data.

4. The circuit device according to claim 3, wherein the voltage output circuit changes a time from the change timing of the input data to the change timing of the output voltage, in accordance with a difference between previous input data and current input data.

5. The circuit device according to claim 1, wherein the voltage output circuit lowers the output voltage below the D/A conversion voltage when the driving voltage undershoots the D/A conversion voltage due to a change of the input data in a negative direction.

6. The circuit device according to claim 1, wherein the overdrive circuit includes:

an arithmetic circuit configured to execute an arithmetic operation to acquire overdrive data corresponding to the overdrive voltage, based on the input data;

first to m-th overdrive capacitors each including one end coupled to the first node; and an overdrive driving circuit configured to drive the other end of each of the first to m-th overdrive capacitors, based on the overdrive data.

7. The circuit device according to claim 6, wherein the arithmetic circuit multiplies a coefficient to a difference between previous input data and current input data, and outputs the overdrive data by using a result of the multiplication.

8. The circuit device according to claim 7, wherein the arithmetic circuit multiplies the coefficient to the difference, the coefficient differing in accordance with the difference.

9. The circuit device according to claim 1, wherein the input data is gradation data, and the amplifier circuit drives an electro-optical panel.

10. An electro-optical device, comprising:

the circuit device according to claim 9; and the electro-optical panel.

11. An electronic apparatus, comprising the circuit device according to claim 1.

* * * * *